United States Patent
Fukano et al.

(10) Patent No.: US 7,597,970 B2
(45) Date of Patent: Oct. 6, 2009

(54) SURFACE COATED MEMBER AND CUTTING TOOL

(75) Inventors: Tsuyoshi Fukano, Satsumasendai (JP); Takahiko Makino, Satsumasendai (JP)

(73) Assignee: Kyocera Corporation, Kyoto (JP)

(*) Notice: Subject to any disclaimer, the term of this patent is extended or adjusted under 35 U.S.C. 154(b) by 454 days.

(21) Appl. No.: 11/387,438

(22) Filed: Mar. 22, 2006

(65) Prior Publication Data

US 2006/0222885 A1    Oct. 5, 2006

(30) Foreign Application Priority Data

| Mar. 22, 2005 | (JP) | ............... 2005-082051 |
| Mar. 22, 2005 | (JP) | ............... 2005-082052 |
| Mar. 29, 2005 | (JP) | ............... 2005-095410 |

(51) Int. Cl.
   *B32B 9/00*    (2006.01)

(52) U.S. Cl. .............. 428/698; 428/336; 428/701; 428/702

(58) Field of Classification Search ........... 428/336, 428/698, 701, 702
See application file for complete search history.

(56) References Cited

U.S. PATENT DOCUMENTS

| 5,266,388 | A | * | 11/1993 | Santhanam et al. | ......... 428/698 |
| 5,395,680 | A | * | 3/1995 | Santhanam et al. | ......... 428/701 |
| 5,942,318 | A | * | 8/1999 | Soderberg et al. | ......... 428/698 |
| 6,183,846 | B1 | * | 2/2001 | Moriguchi et al. | ......... 428/701 |
| 6,293,739 | B1 | * | 9/2001 | Uchino et al. | ......... 428/216 |
| 6,756,111 | B1 | * | 6/2004 | Okada et al. | ......... 428/702 |
| 7,192,660 | B2 | * | 3/2007 | Ruppi | ......... 428/698 |
| 7,422,803 | B2 | * | 9/2008 | Ruppi | ......... 428/698 |

FOREIGN PATENT DOCUMENTS

| JP | 05-220604 | | 8/1993 |
| JP | 06-116731 | | 4/1994 |
| JP | 06-158325 | | 6/1994 |
| JP | 07-062542 | * | 3/1995 |
| JP | 08-132130 | * | 5/1996 |
| JP | 11-140647 | * | 5/1999 |

* cited by examiner

*Primary Examiner*—Archene Turner
(74) *Attorney, Agent, or Firm*—Hogan & Hartson LLP (57) ABSTRACT

A surface coated member comprises a substrate composed of a hard material, and a hard coating layer containing at least a TiCN layer on a surface of the substrate. A ratio r in a region of an outer surface side is larger than a ratio r in a region of an inner surface side, wherein r is a ratio of a peak strength $I_{(422)}$ of a (422)-crystal plane to a peak strength $I_{(111)}$ of a (111)-crystal plane, namely $(I_{(422)}/I_{(111)})$, in an X-ray diffraction analysis of the TiCN layer. The surface coated member has excellent adhesion between the substrate and the hard coating layer, and it also has excellent fracture resistance and wear resistance. Further provided is a cutting tool that includes a rake face and a flank formed on the substrate in the above surface coated member, and a cutting edge formed on a cross ridge portion between the rake face and the flank. Still further provided is a method for manufacturing a work piece to perform cutting process by applying the cutting edge of this cutting tool, to a work material.

11 Claims, 4 Drawing Sheets

SURFACE COATED MEMBER AND CUTTING TOOL

BACKGROUND OF THE INVENTION

1. Field of the Invention

The present invention relates to a surface coated member and a cutting tool, which have a hard coating layer adhered to a surface of a substrate.

2. Description of Related Art

Conventionally, a surface coated member having a hard coating layer adhered to a surface of a substrate has been used for various applications. For example, a surface coated member that has a single or a plurality of hard coating layers such as a TiC layer, a TiN layer, a TiCN layer, an $Al_2O_3$ layer, or a TiAlN layer formed on a surface of a hard substrate such as cemented carbide, cermet, or ceramics is used in cutting work of metal as a cutting tool.

Recently, cutting by which a cutting edge is subject to large shock, for example, heavy interrupted cutting of metal, is increasing as cutting work becomes more efficiently. For this reason, the above-mentioned cutting tool requires further improvement in fracture resistance and in wear resistance.

However, the conventional cutting tool suffers from the following problem. That is, the hard coating layer fails to endure large shock, and it is apt to cause chipping or flaking of the hard coating layer. Such chipping or flaking may trigger accidental tool damage such as fracture of a cutting edge and occurrence of abnormal wear, thereby shortening tool life.

To improve the characteristic of the hard coating layer, Japanese Unexamined Patent Publication No. 5-220604 describes that, by forming, as a first layer, a TiCN layer exhibiting a maximum peak strength on a (422)-crystal plane, the adherence of a TiCN layer can be increased thereby to increase the adhesion to a substrate and other hard layer. Japanese Unexamined Patent Publication No. 6-158325 describes that excellent wear resistance is achieved by forming, as a second layer or succeeding layer, a TiCN layer exhibiting a maximum peak strength on a (422)-crystal plane.

On the other hand, Japanese Unexamined Patent Publication No: 6-116731 describes a plurality of coating layers in which two or more layers selected from a TiC layer, a TiN layer, and a TiCN Layer are formed on a surface of a substrate, and describes that the agreement between the diffraction plane on which a maximum peak strength is achieved in the X-ray diffraction analysis of the first layer and that of the second layer can increase adhesion between layers and also suppress a crack generated in an upper layer from extending to a Lower layer, thereby improving fracture resistance.

Japanese Unexamined Patent Publications No. 5-220604 and No. 6-158325 describe that the TiCN layer exhibiting the maximum peak strength on the (422)-crystal plane has excellent adhesion to a substrate, and excellent wear resistance.

However, under more severe cutting conditions than the cutting conditions described in a preferred embodiment of these publications, particularly under severe cutting conditions to cause accidental large shock such as heavy interrupted cutting, chipping and accidental fracture still occur, thereby shortening tool life. In addition, there is a slight difference between the performance required for a rake face and the performance required for a flank, and only bringing the crystal orientation peak on the (422)-crystal plane to be the maximum cannot satisfy these performances.

A mere agreement between the maximum peak of the first layer and that of the second layer for purposes of increasing the adhesion between the first layer and the second layer and suppressing extension of a crack, as described in Japanese Unexamined Patent Publication No. 6-116731, can improve the adhesion between layers but deteriorate the wear resistance of the second layer, failing to prolong tool life.

If the layer thickness of a hard coating layer is reduced with the purpose of preventing chipping and flaking of the hard coating layer, the hard coating layer may be vanished by wear at an early date, failing to prolong tool life. Moreover, the cutting of steel, etc. requires further improvement in fracture resistance and in wear resistance.

SUMMARY OF THE INVENTION

The present invention provides a surface coated member and a cutting tool designed for long tool life, which have excellent adhesion between a substrate and a hard coating layer, and excellent fracture resistance and wear resistance. More particularly, it is to provide a surface coated member and a cutting tool designed for long tool life, which have excellent fracture resistance and wear resistance even under such severe cutting conditions as to apply large shock to a cutting edge of a tool as in the case with the cutting of metal such as steel, etc., especially interrupted cutting of cast iron.

The present inventors have examined a method for enhancing fracture resistance and wear resistance in a surface coated member having a hard coating layer containing a TiCN layer on a surface of a substrate. Then, the inventors have achieved the present invention based on the following new fact that controlling the nature of an inner surface side of a TiCN layer and the nature of an outer surface side of the TiCN layer to a predetermined state permits a hard coating layer that has high hardness and excellent wear resistance on the outer surface side, and has excellent toughness and excellent adherence to the substrate on the inner surface side.

Specifically, a surface coated member of the present invention comprises a substrate composed of a hard material, and a hard coating layer containing at least a TiCN layer on a surface of the substrate. A ratio r in a region of an outer surface side is larger than a ratio r in a region of an inner surface side, wherein r is a ratio of a peak strength $I_{(422)}$ of a (422)-crystal plane to a peak strength $I_{(111)}$ of a (111)-crystal plane, namely $(I_{(422)}/I_{(111)})$, in an X-ray diffraction analysis of the TiCN layer.

Further, to overcome the above-mentioned problem, the present inventors have examined a method for enhancing fracture resistance, chipping resistance, and wear resistance in a surface coated member having, on a substrate surface, a hard coating layer that contains a TiN layer and a TiCN layer laminated in this order on the surface of the substrate. Then, the inventors have found that controlling the nature of an inner surface side of a TiCN layer and the nature of an outer surface side of the TiCN layer to a predetermined state permits a surface coated member with further improved fracture resistance, chipping resistance, and wear resistance.

Specifically, other surface coated member of the present invention comprises a substrate composed of a hard material, and a hard coating layer containing a TiN layer and a TiCN layer that are laminated in this order on the surface of the substrate. A ratio R in a region of an outer surface side is larger than a ratio R in a region of an inner surface side, wherein R is a ratio of a peak strength $I_{(422)}$ of a (422)-crystal plane to a peak strength $I_{(hkl)}$ of a (hkl)-crystal plane (except for a (422)-crystal plane), namely $(I_{(422)}/I_{(hkl)})$ in the X-ray diffraction analysis of the TiCN layer and the (hkl)-crystal plane is a diffraction plane on which a maximum peak strength is achieved in the X-ray diffraction analysis of the TiN layer.

In a cutting tool of the present invention, a rake face and a flank are formed on the substrate of the above-mentioned surface coated member and a cutting-edge is formed on a cross ridge portion between the rake face and the flank.

Other cutting tool of the present invention comprises a substrate composed of cemented carbide, and a hard coating layer containing a TiCN layer, which is coated on a surface of the substrate. A rake face and a flank are formed on the substrate. A cutting edge is formed on a cross ridge portion between the rake face and the flank. A texture coefficient $T_{CR}$ is larger than a texture coefficient $T_{CF}$, wherein the texture coefficient Tc of a (422)-crystal plane of the TiCN layer is a value calculated by the following equation (I) in an X-ray diffraction analysis of the TiCN layer; $T_{CR}$ is a texture coefficient $T_C$ of the rake face; and $T_{CF}$ is a texture coefficient $T_C$ of the flank.

$$T_C = I_{(422)}/A \quad \text{(I)}$$

$$A: \frac{I_{(422)} + I_{(111)} + I_{(200)} + I_{(311)} + I_{(420)} + I_{(220)}}{6}$$

A method for manufacturing a work piece of the present invention is to perform cutting work by applying a cutting edge formed on a cross ridge portion between the rake face and the flank of the above-mentioned cutting tool, to a work material.

In accordance with the present invention, the ratio r or R in the region of the outer surface side of the TiCN layer is larger than the ratio r or R in the region of the inner surface side of the TiCN layer. This achieves a hard coating layer that has high hardness and excellent wear resistance on the outer surface side, and has excellent toughness and excellent adherence to the substrate on the inner surface side. This ensures high wear resistance under cutting conditions that requires wear resistance as in the case with continuous cutting. Additionally, in the event that the hard coating layer is subject to accidental large shock in machining that requires fracture resistance as in the case with interrupted cutting, the shock can be absorbed, and the possibility of wide flaking between layers of a plurality of layers constituting the hard coating layer, and between the hard coating layer and the substrate, and the possibility of chipping and flaking of the entire hard coating layer can be reduced.

It is therefore possible to obtain a cutting tool that ensures excellent fracture resistance and wear resistance in, of course, cutting of steel, particularly under severe cutting conditions to apply large shock to a cutting edge of a tool as in the case with heavy interrupted cutting of metal such as cast iron in which graphite particles of high hardness are dispersed, for example, gray cast iron (FC material) and ductile cast iron (FCD material), as well as under continuous cutting, and under conditions of a complex cutting that is a combination of interrupted cutting and continuous cutting.

The surface coated member with the above construction is applicable to a variety of uses in tools such as cutting tools, excavating tools, and knives. In particular, when used as a cutting tool that performs cutting work by applying a cutting edge formed on a cross ridge portion between a rake face and a flank, to a work material, the above-mentioned excellent effect becomes significant. Likewise, a high degree of mechanical reliability is attainable in other applications.

DETAILED DESCRIPTION OF PREFERRED EMBODIMENTS

<Surface Coated Member>

First Preferred Embodiment

Figure 1:
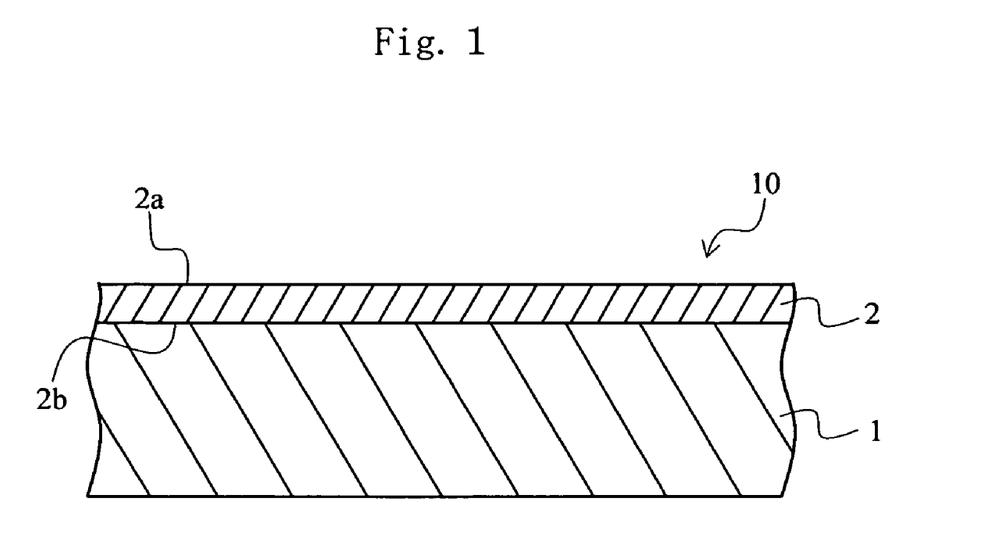
FIG. 1 is a schematic explanatory diagram for the sake of explaining a first preferred embodiment in a surface coated member of the present invention.

A first preferred embodiment of a surface coated member of the present invention will be described in detail with reference to the accompanying drawings. FIG. 1 is a schematic explanatory diagram for the sake of explaining a surface coated member in the first preferred embodiment. As shown in FIG. 1, a surface coated member 10 includes a hard coating layer containing a TiCN layer 2, which is adhered to a surface of a substrate 1 composed of a hard material.

Examples of the hard material are cemented carbide that can be obtained by binding a hard phase with a binding phase composed of at least one iron family metal selected from, for example, cobalt (Co) and nickel (Ni); and hard alloy composed of cermet. As a hard phase, there can be used tungsten carbide (WC) or titanium carbide (TiC) or titanium carbonitride (TiCN), and, as required, at least one selected from the group consisting of carbides, nitrides, and carbonitrides of the groups 4, 5, and 6 metals in the periodic table. For example, ceramic sintered body of silicon nitride ($Si_3N_4$) or aluminum oxide ($Al_2O_3$), and super hard sintered body composed mainly of cubic system boron nitride (cBN) or diamond, are also suitable as a hard material. Among these hard materials, the above-mentioned cemented carbide is preferred because it can exhibit high cutting performance to a wide variety of work materials.

In the surface coated member 10 of the first preferred embodiment, a ratio r in a region of an outer surface 2a side is larger than a ratio r in a region of an inner surface 2b side, wherein r is a ratio of a peak strength $I_{(422)}$ of a (422)-crystal plane to a peak strength $I_{(111)}$ of a (111)-crystal plane, namely ($I_{(422)}/I_{(111)}$), in an X-ray diffraction analysis (XRD) of the TiCN layer 2. This produces the hard coating layer that has high hardness and excellent wear resistance on the outer surface 2a side, and has excellent toughness and excellent adherence to the substrate 1 on the inner surface 2b side. As a result, in a cutting tool coated with the hard coating layer, excellent wear resistance is achieved even under cutting conditions that requires wear resistance as in the case with continuous cutting, and excellent fracture resistance is achieved even under cutting conditions that requires fracture resistance as in the case with interrupted cutting.

On the contrary, unless the above-mentioned ratio r in the respective regions of the outer surface 2a side and the inner surface 2b side satisfies a predetermined relationship, wear resistance and fracture resistance are lowered.

Preferably, the ratio r is progressively increased from the inner surface 2b side to the outer surface 2a side. This enables fracture resistance to be more improved.

In particular, $r_A$ may be not more than 0.5, preferably 0.01 to 0.5, more preferably 0.1 to 0.5 and $r_B$ may be not less than 1, preferably 1 to 10, more preferably 1.2 to 5, wherein $r_A$ is a ratio r when an X-ray diffraction analysis is conducted in a state in which a region extending in a thickness of not more than 1.5 μm from the interface on the inner surface 2b side is exposed in the TiCN layer 2; and $r_B$ is a ratio r when an X-ray diffraction analysis is conducted in a state in which a region extending in a thickness of not more than 1.5 μm from the interface on the outer surface 2a side is exposed in the TiCN layer 2. This enables to increase the adherence between the TiCN layer 2 and the adjacent substrate 1. Likewise, the adherence between the TiCN layer 2 and the respective adjacent layers can be increased when the hard coating layer is formed by a plurality of layers to be described later.

As a method for exposing the region extending in a thickness of not more than 1.5 μm from the interface on the inner surface 2b side, any method which can expose the TiCN layer 2 without deteriorating it may be employed. For example, the hard coating layer may be exposed by means of polishing, etching, or the like. This is true for the outer surface 2a side.

The layer thickness of the TiCN layer 2 is 2 to 20 μm, preferably about 3 to 15 μm. The layer thickness of the hard coating layer including this TiCN layer 2 is 3 to 20 μm, preferably about 8 to 15 μm.

Although the hard coating layer is made up of the TiCN layer 2 alone in the first preferred embodiment, the present invention is not limited to this, but the hard coating layer may be formed by a plurality of layers including the TiCN layer 2. Specifically, it is desirable that the hard coating layer has an $Al_2O_3$ layer on the outer surface 2a side of the TiCN layer 2. This achieves an improvement in oxidation resistance of the hard coating layer, leading to an improvement in wear resistance. More preferably, the $Al_2O_3$ layer has α type crystalline structure. This achieves a stable structure, so that excellent wear resistance can be maintained at high temperatures. That is, the effect of improving wear resistance is further enhanced.

Conventionally, there was the problem that, although aluminum oxide of α type crystalline structure has excellent wear resistance, the particle size at the time of nucleation is large, and hence the area contacting with the TiCN layer is decreased and adherence is lowered, thus being susceptible to layer flaking. On the other hand, the present invention can control the adherence between the $Al_2O_3$ layer and the TiCN layer to a predetermined range by the above-mentioned adjustment of structure. Hence, sufficient adhesion is attainable even if the $Al_2O_3$ layer is taken to be α type crystalline structure. Therefore, without lowering the adhesion of the $Al_2O_3$ layer, excellent wear resistance derived from the α type crystalline structure can be obtained, resulting in a surface coated member having a longer life. Alternatively, the adherence of the $Al_2O_3$ layer can also be controlled by taking part of $Al_2O_3$ crystal to be κ type crystalline structure other than the α type crystalline structure, namely by taking the crystalline structure of the $Al_2O_3$ layer to be a mixed crystal where both the α type crystalline structure and the κ type crystalline structure exist.

Preferably, at least one layer selected from the group consisting of a TiN layer, a TiCN layer, a TiC layer, a TiCNO layer, a TiCO layer, and a TiNO layer (hereinafter referred to as "other Ti hard layer") is formed in a layer thickness of 0.01 to 0.2 μm between the TiCN layer 2 and the $Al_2O_3$ layer. This facilitates control of the adherence between the TiCN layer 2 and the $Al_2O_3$ layer, thus enhancing adhesion therebetween. When a TiCN layer is interposed between the TiCN layer 2 and the $Al_2O_3$ layer, the TiCN layer and the TiCN layer 2 may be the same or different in structural form such as crystalline structure.

More preferably, the above-mentioned other Ti hard layer is formed on a lower layer of the TiCN layer 2 (the inner surface 2b side) and/or on an upper layer of the $Al_2O_3$ layer (the outer surface 2a side). The presence of the Ti hard layer on the lower layer of the TiCN layer 2 produces the effect of suppressing diffusion of the substrate component, and the effect of controlling easily the crystalline structure of the TiCN layer 2. The presence of the Ti hard layer on the upper layer of the $Al_2O_3$ layer enables control of the sliding performance and the appearance of the surface of the hard coating layer.

Specifically, it is desirable that an under layer composed of TiN is formed in a layer thickness of 0.1 to 2 μm between the substrate 1 and the TiCN layer 2, in order to improve the adherence of the TiCN layer 2, and prevent wear resistance from lowering due to diffusion of the substrate component. In some cases, carbon may diffuse from the substrate 1 or the TiCN layer 2, so that the TiN layer as the under layer may be absorbed by the TiCN layer 2 and then disappear.

When the $Al_2O_3$ layer is taken to be α type crystalline structure, it is desirable to form an intermediate layer selected from the group consisting of layers containing at least titanium and oxygen such as a $Ti_2O_3$ layer, a $TiO_2$ layer, a TiCO layer, a TiNO layer, a TiCNO layer and $TiC_xN_yO_z$ (x+y+z=1, $0 \leq x \leq 1, 0 \leq y \leq 1, 0 \leq z \leq 1$, especially $z \geq 0.1$) in a layer thickness of not more than 1 μm. This ensures a stable growth of the α type crystalline structure. More preferably, the intermediate layer has a layer thickness of not more than 0.5 μm. This facilitates control of the adherence of the $Al_2O_3$ layer.

It is further desirable to form a layer composed of TiN on an upper layer of the $Al_2O_3$ layer, namely on a surface layer of the hard coating layer. As a result, the surface coated member 10 is golden-colored. When the surface coated member 10 is applied to a cutting tool to be described later, it is distinguishable whether or not a surface layer is worn and spent. It is also easy to check the progress of wear. The surface layer is not limited to a TiN layer, but a DLC (diamond-like carbon) layer or a CrN layer may be formed to increase sliding performance.

Preferably, the TiN layer serving as a surface layer has a layer thickness of not more than 1 μm. Preferably, the peel strength of the surface layer is lower than that of the $Al_2O_3$ layer. This facilitates visual check as to whether it has been used or not.

Second Preferred Embodiment

Figure 2:
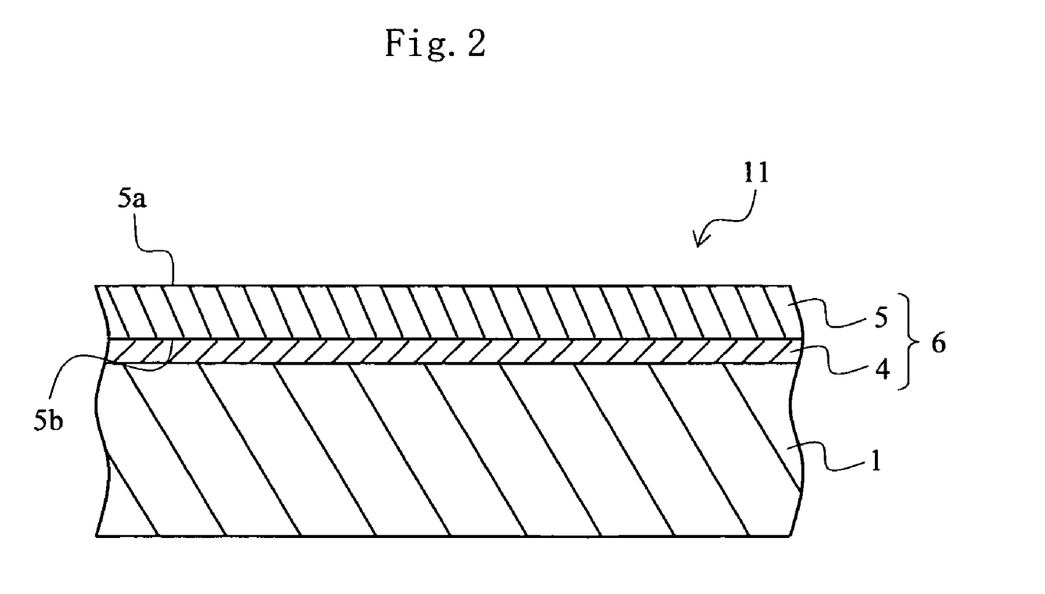
FIG. 2 is a schematic explanatory diagram for the sake of explaining a second preferred embodiment in the surface coated member of the present invention.

A second preferred embodiment of a surface coated member of the present invention will be described in detail with reference to the accompanying drawings. FIG. 2 is a schematic explanatory diagram for the sake of explaining a surface coated member in the second preferred embodiment. In FIG. 2, the same reference numerals have been used as in FIG. 1 for identical or similar components, and the description thereof has been left out of the following.

As shown in FIG. 2, a surface coated member 11 includes a hard coating layer 6, which is adhered to a surface of a substrate 1. The hard coating layer 6 contains a TiN layer 4 and a TiCN layer 5 that are laminated in this order on the surface of the substrate 1.

In the surface coated member 11 of the second preferred embodiment, a ratio R in a region of an outer surface 5a side of the TiCN layer 5 is larger than a ratio R in a region of an inner surface 5b side, wherein a (hkl)-crystal plane (except for a (422)-crystal plane) is a diffraction plane on which a maximum peak strength is achieved in an X-ray diffraction analysis of the TiN layer 4; and R is a ratio of a peak strength $I_{(422)}$ of the (422)-crystal plane to a peak strength $I_{(hkl)}$ of the (hkl)-crystal plane, namely ($I_{(422)}/I_{(hkl)}$), in the X-ray diffraction analysis of the TiCN layer 5.

This produces the hard coating layer 6 that has high hardness and excellent wear resistance on the outer surface 5a side, and has excellent toughness and excellent adherence to a substrate 1 on the inner surface 5b side. Moreover, in a cutting tool coated with the hard coating layer 6, high wear resistance is achieved even under cutting conditions that requires wear resistance as in the case with continuous cutting. In machining that requires fracture resistance as in the case with interrupted cutting, even if the hard coating layer 6 is subject to accidental large shock, the hard coating layer 6 can absorb the shock because it has high toughness and high adherence with the substrate 1. Consequently, the possibility of wide flaking between layers of the respective layers constituting the hard coating layer 6, and the possibility of chipping and flaking of the entire hard coating layer 6 can be reduced. On the contrary, unless the above-mentioned ratio R in the respective regions of the outer surface 5a side and the inner surface 5b side satisfies a predetermined relationship, wear resistance and fracture resistance are lowered.

In the second preferred embodiment, preferably, the (hkl)-crystal plane is a diffraction plane on which the maximum peak strength is attained in a region on the inner surface 5b side of the TiCN layer 5, especially in a region in the vicinity of the interface of the inner surface 5b side. This further enhances fracture resistance.

Preferably, the ratio R is progressively increased from the inner surface 5b side to the outer surface 5a side. This further enhances fracture resistance.

In particular, a ratio $R_A$ may be not more than 0.5, preferably 0.01 to 0.5, more preferably 0.1 to 0.5 and a ratio $R_B$ may be not less than 1, preferably 1 to 10, more preferably 1.2 to 5, wherein $R_A$ is the ratio R when an X-ray diffraction analysis is conducted in a state in which a region extending in a thickness of not more than 1.5 μm from the interface on the inner surface 5b side is exposed in the TiCN layer 5; and $R_B$ is the ratio R when an X-ray diffraction analysis is conducted in a state in which a region extending in a thickness of not more than 1.5 μl m from the interface on the outer surface 5a side is exposed in the TiCN layer 5. This enhances the adherence between the TiCN layer 5 and the adjacent TiN layer 4 or the substrate 1. Moreover, the adherence between the TiCN layer 5 and the respective adjacent layers can be enhanced when the hard coating layer 6 is formed by a plurality of layers.

A method for exposing a predetermined region on the inner surface 5b side and the outer surface 5a side may be the same as that for the inner surface 2b side and the outer surface 2a side, as above described.

The layer thickness of the TiN layer 4 is 0.01 to 3 μm, preferably about 0.1 to 2 μm. The layer thickness of the TiCN layer 5 is 2 to 20 μm, preferably about 3 to 15 μm. The layer thickness of the hard coating layer 6 including the TiN layer 4 and the TiCN layer 5 is 2 to 20 μm, preferably about 8 to 15 μm.

Like the foregoing preferred embodiment, it is desirable that the hard coating layer 6 has an $Al_2O_3$ layer on the outer surface 5a side of the TiCN layer 5, in order to improve the oxidation resistance and wear resistance of the hard coating layer 6. More preferably, the $Al_2O_3$ layer has α type crystalline structure, in order to further enhance wear resistance.

Like the foregoing preferred embodiment, preferably, at least one layer selected from the group consisting of a TiN layer, a TiCN layer, a TiC layer, a TiCNO layer, a TiCO layer, and a TiNO layer (hereinafter referred to as "other Ti hard layer") is formed in a layer thickness of 0.01 to 0.2 μm between the TiCN layer 5 and the $Al_2O_3$ layer. This is because the control of the adherence between the TiCN layer 5 and the $Al_2O_3$ layer can be facilitated, and the adhesion therebetween can be enhanced.

Otherwise, the construction is identical to the first preferred embodiment, and the description thereof is therefore omitted here.

<Cutting Tool>

The surface coated member of the present invention as above described is applicable to a variety of uses in tools such as cutting tools, excavating tools, and knives. In particular, when used as a cutting tool that performs cutting work by applying a cutting edge formed on a cross ridge portion between a rake face and a flank, to a work material, the above-mentioned excellent effects can be achieved.

First Preferred Embodiment

Figure 3:
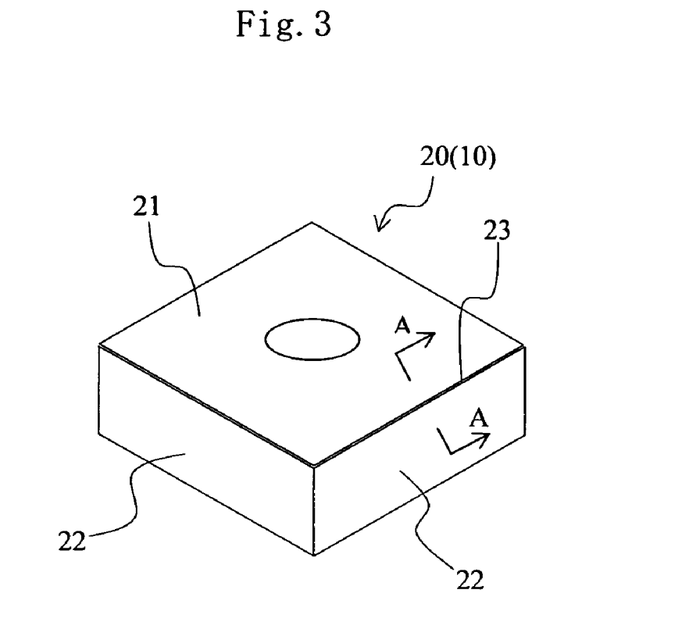
FIG. 3 is a schematic perspective view illustrating a first preferred embodiment in a cutting tool of the present invention.
Figure 4:
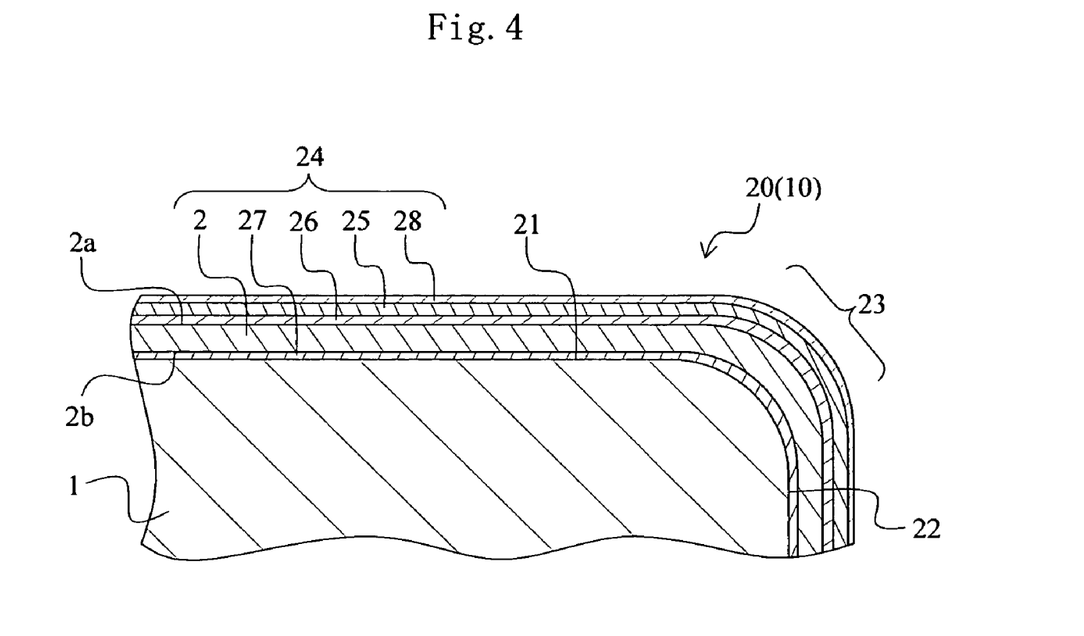
FIG. 4 is a sectional view taken along the line A-A in FIG. 3.

A first preferred embodiment of a cutting tool of the present invention will be described in detail with reference to the accompanying drawings. FIG. 3 is a schematic perspective view for the sake of explaining a cutting tool in the first preferred embodiment. FIG. 4 is a sectional view taken along the line A-A in FIG. 3. In FIGS. 3 and 4, the same reference numerals have been used as in FIG. 1 for identical or similar components, and the description thereof has been left out of the following.

The cutting tool of the first preferred embodiment can be achieved by applying the surface coated member 10 of the foregoing first preferred embodiment to a cutting tool. Specifically, as shown in FIGS. 3 and 4, a cutting tool 20 is a cutting insert, in which a rake face 21 and a flank 22 are formed on a substrate 1, and a cutting edge 23 is formed on a cross ridge portion between the rake face 21 and the flank 22. The surface of the substrate 1 is coated with a hard coating layer 24. The hard coating layer 24 is formed by a plurality of layers including the TiCN layer 2 described above.

In the cutting tool 20, a ratio ($r_{AR}/r_{AF}$) is 1.1 to 5, wherein $r_{AR}$ is the above-mentioned ratio r when an X-ray diffraction analysis is conducted in a state in which a region extending in a thickness of not more than 1.5 μm from the interface on an inner surface 2b side is exposed in the TiCN layer 2 existing on the rake face 21; and $r_{AF}$ is the above-mentioned ratio r when an X-ray diffraction analysis is conducted in a state in which a region extending in a thickness of not more than 1.5 μm from the interface on the inner surface 2b side is exposed in the TiCN layer 2 existing on the flank 22. Moreover, a ratio ($r_{BR}/r_{BF}$) is 1.5 to 10, wherein $r_{BR}$ is the above-mentioned ratio r when an X-ray diffraction analysis is conducted in a state in which a region extending in a thickness of not more than 1.5 μm from the interface on the outer surface 2a side is exposed in the TiCN layer 2 existing on the rake face 21; and $r_{BF}$ is the above-mentioned ratio r when an X-ray diffraction analysis is conducted in a state in which a region extending in a thickness of not more than 1.5 μm from the interface on the outer surface 2a side is exposed in the TiCN layer 2 existing on the flank 22. This enhances the fracture resistance and the wear resistance of the cutting tool 20. As a method for exposing each region, the same method as above can be cited.

Especially, it is desirable that a ratio r' on the outer surface 2a side is larger than a ratio r' on the inner surface 2b side, wherein r' is a ratio of a peak strength $I_{(311)}$ of a (311)-crystal plane to a peak strength $I_{(220)}$ of a (220)-crystal plane, namely ($I_{(311)}/I_{(220)}$), in the X-ray diffraction analysis of the TiCN layer 2. This improves the adhesion to the substrate 1, and suppresses the hard coating layer 24 itself from being damaged at cutting.

The hard coating layer 24 is formed by a plurality of layers including the TiCN layer 2. Specifically, as shown in FIG. 4, an $Al_2O_3$ layer 25 is formed on the outer surface 2a side of the TiCN layer 2. Preferably, the $Al_2O_3$ layer 25 has α type crystalline structure, as above described, from the viewpoint that a stable structure is attained, and excellent wear resistance can be maintained at high temperatures. Alternatively, the adherence of the $Al_2O_3$ layer 25 can also be controlled by taking part of $Al_2O_3$ crystal to be κ type crystalline structure other than the α type crystalline structure, namely by taking the crystalline structure of the $Al_2O_3$ layer 25 to be a mixed crystal containing both the α type crystalline structure and the κ type crystalline structure.

When the $Al_2O_3$ layer 25 is taken to be α type crystalline structure, it is desirable to form an intermediate layer 26 composed of a hard layer containing at least titanium and oxygen such as a $TiO_2$ layer, a $Ti_2O_3$ layer, a TiCO layer, a TiNO layer and a TiCNO layer between the TiCN layer 2 and the $Al_2O_3$ layer 25. This ensures a stable growth of the α type crystalline structure.

Moreover, as an under layer, a TiN layer 27 is formed on a surface of the substrate 1. This produces the effect of suppressing the component of the substrate 1 from diffusing into the hard coating layer 24, and the effect of controlling easily the particle shape of the TiCN layer 2.

Further, a TiN layer 28 is formed as an upper layer (on the outer surface side) of the $Al_2O_3$ layer 25, namely as a surface layer of the hard coating layer 24. As a result, the cutting tool 20 is golden-colored. When the cutting tool 20 is used, it is distinguishable whether or not the TiN layer 28 is worn and spent. It is also easy to check the progress of wear. As above described, the surface layer is not limited to the TiN layer 28, but in some cases a DLC (diamond-like carbon) layer or a CrN layer may be formed to increase sliding performance.

The following is a method for manufacturing the cutting tool 20. First, metal powder, carbon powder, or the like are suitably added to and mixed with inorganic powder such as metal carbide, nitride, carbonitride, oxide, which can form the above-mentioned cemented carbide by sintering. Subsequently, with a known forming method such as press forming, casting forming, extrusion forming, or cold isostatic hydraulic press forming, this is formed in a predetermined tool shape, followed by sintering in vacuum or nonoxidizing atmosphere, thereby manufacturing a substrate 1 composed of the above-mentioned hard material. The surface of the substrate 1 is then subjected to polishing process, and a cutting edge part 23 is subjected to honing process, as required.

Preferably, the substrate 1 has the following surface roughness in order to control the adherence of the hard coating layer 24. Specifically, the particle size of raw material powder, a forming method, a sintering method, a processing method are controlled such that the arithmetic mean roughness (Ra) in the rake face 21 is 0.1 to 1.5 μm, and the arithmetic mean roughness (Ra) in the flank 22 is 0.5 to 3.0 μm. The values of the arithmetic mean roughness (Ra) are based on JISB0601-2001.

Subsequently, the hard coating layer 24 is formed on the surface of the substrate 1 with chemical vapor deposition (CVD) method, for example. Specifically, there is prepared, as a reaction gas composition, a mixed gas consisting of 0.1 to 10 vol. % of titanium tetrachloride ($TiCl_4$) gas, 5 to 60 vol. % of nitrogen ($N_2$) gas, and the rest, namely hydrogen ($H_2$) gas. This mixed gas is then introduced into a reaction reactor, and the TiN layer 27 as an under layer is formed within the reactor under conditions of 800 to 1000° C. and 10 to 30 kPa.

Next, as a reaction gas composition, a mixed gas consisting of 0.1 to 10 vol. % of titanium tetrachloride ($TiCl_4$) gas, 0 to 60 vol. % of nitrogen ($N_2$) gas, 0 to 0.1 vol. % of methane ($CH_4$) gas, 0.1 to 0.4 vol. % of acetonitrile ($CH_3CN$) gas, and the rest, namely hydrogen ($H_2$) gas is introduced into the reaction reactor, and the TiCN layer 2 is formed within the reactor under conditions of 780 to 950° C. and 5 to 25 kPa.

The above-mentioned construction of the structure of the TiCN layer 2 is attainable by setting the above layer forming conditions such that the ratio of the flow rate of the titanium tetrachloride ($TiCl_4$) gas to the flow rate of acetonitrile ($CH_3CN$) gas in the reaction gas at the later stage of forming the TiCN layer 2, that is, (titanium tetrachloride ($TiCl_4$) gas/ acetonitrile ($CH_3CN$) gas) is larger than that at the initial stage of forming the TiCN layer 2, that is, (titanium tetrachloride ($TiCl_4$) gas/acetonitrile ($CH_3CN$) gas). More preferably, the ratio (titanium tetrachloride ($TiCl_4$) gas/acetonitrile ($CH_3CN$) gas) at the later stage of forming the TiCN layer 2 is not less than 1.5 times that at the initial stage of forming the TiCN layer 2. This permits reliable control.

Preferably, the flow rate of nitrogen ($N_2$) gas at the initial stage of layer formation is 5 to 50 vol. %, and the flow rate at the later stage is two times that at the initial stage. Preferably, the layer forming temperature at the initial stage is 850 to 950° C., and the layer forming temperature at the later stage is 780 to 900° C., desirably lower than that at the initial stage by not less than 50° C. Preferably, the above-mentioned layer forming conditions are gradually changed.

If desired, an intermediate layer 26 is then formed. For example, when a TiCNO layer is formed as the intermediate layer 26, a mixed gas consisting of 0.1 to 3 vol. % of titanium tetrachloride ($TiCl_4$) gas, 0.1 to 10 vol. % of methane ($CH_4$) gas, 0.01 to 5 vol. % of carbon dioxide ($CO_2$) gas, 0 to 60 vol. % of nitrogen ($N_2$) gas, and the rest, namely hydrogen ($H_2$) gas is introduced into a reaction reactor at 800 to 1100° C. and 5 to 30 kPa.

Additionally, for example, when a TiCN layer is formed as the intermediate layer 26, a mixed gas consisting of 0.1 to 10 vol. % of $TiCl_4$ gas, 0 to 60 vol. % of $N_2$ gas, 0.1 to 10 vol. % of $CH_4$ gas and the rest, namely $H_2$ gas is prepared as a reaction gas composition and introduced into a reaction reactor at 800 to 1100° C. and 5 to 85 kPa.

Subsequently, an $Al_2O_3$ layer 25 is formed. Preferably, the $Al_2O_3$ layer 25 is formed at 900 to 1100° C. and 5 to 10 kPa by using a mixed gas consisting of 3 to 20 vol. % of aluminum chloride ($AlCl_3$) gas, 0.5 to 3.5 vol. % of hydrogen chloride (HCl) gas, 0.01 to 5.0 vol. % of carbon dioxide ($CO_2$) gas, 0 to 0.01 vol. % of hydrogen sulfide ($H_2S$) gas, and the rest, namely hydrogen ($H_2$) gas.

To form a TiN layer 28 as a surface layer, a mixed gas consisting of 0.1 to 10 vol. % of titanium tetrachloride ($TiCl_4$) gas, 5 to 60 vol. % of nitrogen ($N_2$) gas, and the rest, namely hydrogen ($H_2$) gas may be prepared as a reaction gas composition, and then introduced into a reaction reactor at 800 to 1100° C. and 5 to 85 kPa.

Thereafter, at least a cutting edge part 23 on the surface of the hard coating layer 24 so formed is subjected to polishing process. This polishing process releases the residual stress remaining in the hard coating layer 24, and leads to a cutting tool 20 having further excellent fracture resistance.

Second Preferred Embodiment

Figure 5:
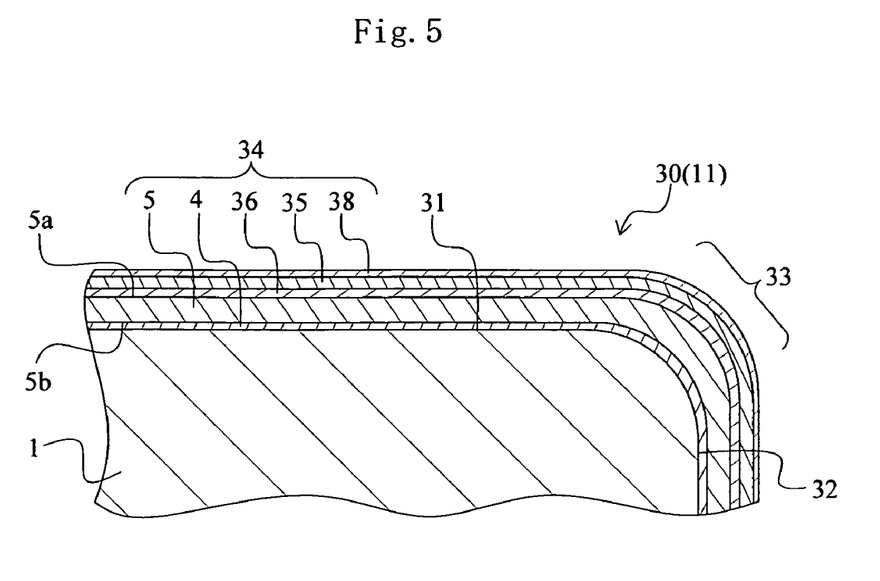
FIG. 5 is a schematic sectional view illustrating a second preferred embodiment in the cutting tool of the present invention.

A second preferred embodiment of a cutting tool will next be described in detail with reference to the accompanying drawings. FIG. 5 is a schematic sectional view illustrating a cutting tool according to the second preferred embodiment. In FIG. 5, the same reference numerals have been used as in FIGS. 1 to 4 for identical or similar components, and the description thereof has been left out of the following.

The cutting tool of the second preferred embodiment can be achieved by applying the surface coated member 11 of the foregoing second preferred embodiment to a cutting tool. Specifically, as shown in FIG. 5, a cutting tool 30 has a rake face 31 and a flank 32 that are formed on a substrate 1, and a cutting edge 33 is formed on a cross ridge portion between the rake face 31 and the flank 32. The surface of the substrate 1 is coated with a hard coating layer 34. The hard coating layer 34 is made up of a plurality of layers including the TiN layer 4 and the TiCN layer 5 described above.

In the cutting tool 30, a ratio ($R_{AR}/R_{AF}$) is 1.1 to 5, wherein $R_{AR}$ is the above-mentioned ratio R when an X-ray diffraction analysis is conducted in a state in which a region extending in a thickness of not more than 15 μm from the interface on an inner surface 5b side is exposed in the TiCN layer 5 existing on the rake face 31; and $R_{AF}$ is the above-mentioned ratio R when an X-ray diffraction analysis is conducted in a state in which a region extending in a thickness of not more than 1.5 μm from the interface on the inner surface 5b side is exposed in the TiCN layer 5 existing on the flank 32. Moreover, a ratio ($R_{BR}/R_{BF}$) is 1.5 to 10, wherein $R_{BR}$ is the above-mentioned ratio R when an X-ray diffraction analysis is conducted in a state in which a region extending in a thickness of not more than 1.5 μm from the interface on the outer surface 5a side is exposed in the TiCN layer 5 existing on the rake face 31; and $R_{BF}$ is the above-mentioned ratio R when an X-ray diffraction analysis is conducted in a state in which a region extending in a thickness of not more than 1.5 μm from the interface on the outer surface 5a side is exposed in the TiCN layer 5 existing on the flank 32. This enhances the fracture resistance and the wear resistance of the cutting tool 30. As a method for exposing each region, the same method as above can be cited.

Especially, it is desirable that a ratio R' on the outer surface 5a side is larger than a ratio R' on the inner surface 5b side, wherein R' is a ratio of a peak strength $I_{(311)}$ of a (311)-crystal plane to a peak strength $I_{(220)}$ of a (220)-crystal plane, namely ($I_{(311)}/I_{(220)}$), in the X-ray diffraction analysis of the TiCN layer 5. This improves the adhesion to the substrate 1, and suppresses the hard coating layer 34 itself from being damaged at cutting.

The hard coating layer 34 is formed by a plurality of layers including a TiN layer 4 and a TiCN layer 5. Specifically, like the foregoing preferred embodiment, an $Al_2O_3$ layer 35 is formed on the outer surface 5a side of the TiCN layer 5. An intermediate layer 36 is formed between the TiCN layer 5 and the $Al_2O_3$ layer 35. A TiN layer 38 is formed above the $Al_2O_3$ layer 35, namely as a surface layer of the hard coating layer 34.

The following is a method for manufacturing the cutting tool 30. First, a substrate 1 is prepared in the same manner as in the foregoing preferred embodiment. The surface of the substrate 1 is then subjected to polishing process, and a cutting edge part is subjected to honing process, as required.

Preferably, the surface roughness of the substrate 1 is a predetermined arithmetic mean roughness (Ra) in order to control the adherence of the hard coating layer 34, like the foregoing preferred embodiment.

Subsequently, the hard coating layer 34 is formed on the surface of the substrate 1 with chemical vapor deposition (CVD) method, for example. Specifically, there is first prepared, as a reaction gas composition, a mixed gas consisting of 0.1 to 10 vol. % of titanium tetrachloride ($TiCl_4$) gas, 5 to 60 vol. % of nitrogen ($N_2$) gas, and the rest, namely hydrogen ($H_2$) gas. This mixed gas is then introduced into a reaction reactor, and the TiN layer 4 as an under layer is formed within the reactor at 800 to 1000° C. and 10 to 30 kPa. At this time, the maximum peak in the X-ray diffraction chart of the TiN layer 4 can be changed by controlling the ratios in vol. % of the titanium tetrachloride ($TiCl_4$) gas and the nitrogen ($N_2$) gas, and the reactor temperature among the above-mentioned forming conditions.

Next, as a reaction gas composition, a mixed gas consisting of 0.1 to 10 vol. % of titanium tetrachloride ($TiCl_4$) gas, 0 to 60 vol. % of nitrogen ($N_2$) gas, 0 to 0.1 vol. % of methane ($CH_4$) gas, 0.1 to 0.4 vol. % of acetonitrile ($CH_3CN$) gas, and the rest, namely hydrogen ($H_2$) gas is prepared and introduced into the reaction reactor, and the TiCN layer 5 is formed within the reactor of 780 to 950° C. and 5 to 25 kPa.

Like the foregoing preferred embodiment, among the above forming conditions, the ratio ($TiCl_4$ gas/$CH_3CN$ gas) of the flow rate of $TiCl_4$ gas to the flow rate of $CH_3CN$ gas in the reaction gas at the initial stage of forming the TiCN layer 5 and the ratio ($TiCl_4$ gas/$CH_3CN$ gas) in the reaction gas at the later stage of forming the TiCN layer 5 may have predetermined relationship. Also, as for the flow rate of nitrogen gas and the layer forming temperature, the conditions are the same as the foregoing preferred embodiment.

Particularly, in the second preferred embodiment the ratio of peaks of a (hkl)-crystal plane on the inner surface 5b side of the TiCN layer 5, that is, the peaks of the same surface as the maximum peak of the TiN layer 4, can be increased by controlling $CH_3CN$ so that the forming conditions of the TiCN layer 5 can satisfy the above-mentioned conditions, while viewing the forming conditions of the TiN layer 4 such as the composition proportions of the mixed gas and the layer forming temperature.

If desired, an intermediate layer 36 is then formed. For example, if a TiCNO layer is formed as the intermediate layer 36, it may be formed in the same manner as in the case with the intermediate layer 26 in the foregoing first preferred embodiment.

Subsequently, an $Al_2O_3$ layer 35 is formed. The $Al_2O_3$ layer 35 may be formed in the same manner as in the case with the $Al_2O_3$ layer 25 in the foregoing first preferred embodiment.

Likewise, a TiN layer 38 may be formed in the same manner as in the case with the TiN layer 28 in the foregoing first preferred embodiment.

Thereafter, at least a cutting edge part 33 on the surface of the hard coating layer 34 so formed is subjected to polishing process. This polishing process releases the residual stress remaining in the hard coating layer 34, and leads to a cutting tool 30 having further excellent fracture resistance.

Third Preferred Embodiment

Figure 6:
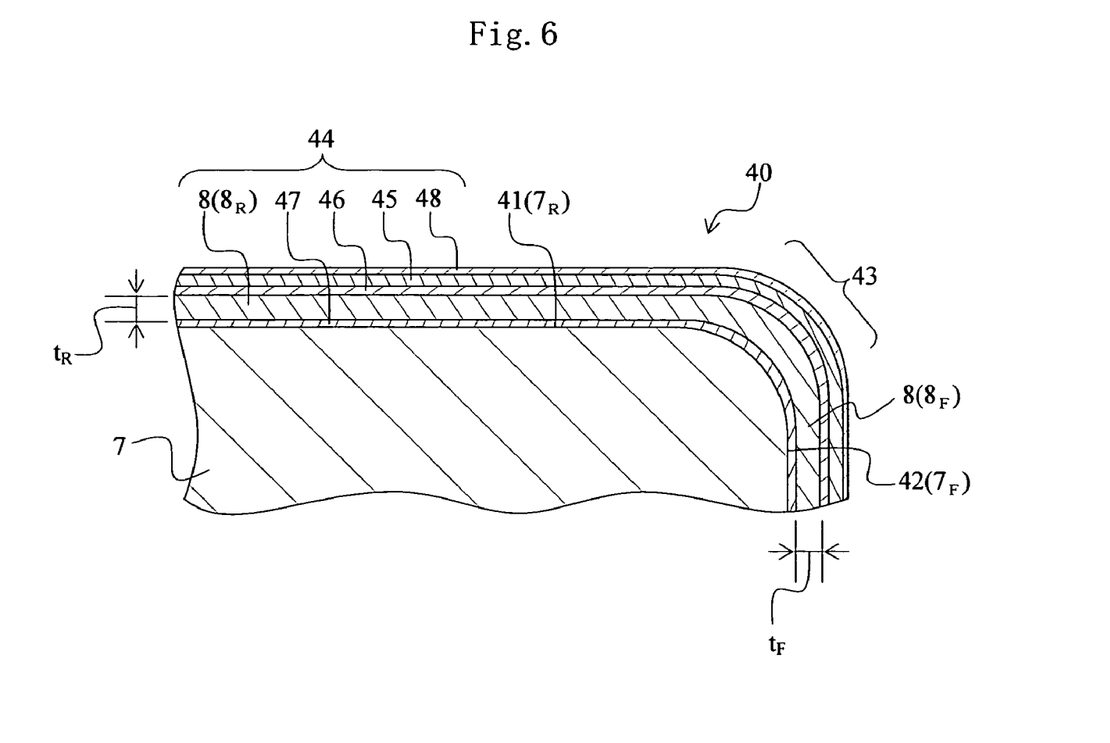
FIG. 6 is a schematic sectional view illustrating a third preferred embodiment in the cutting tool of the present invention.
Figure 7:
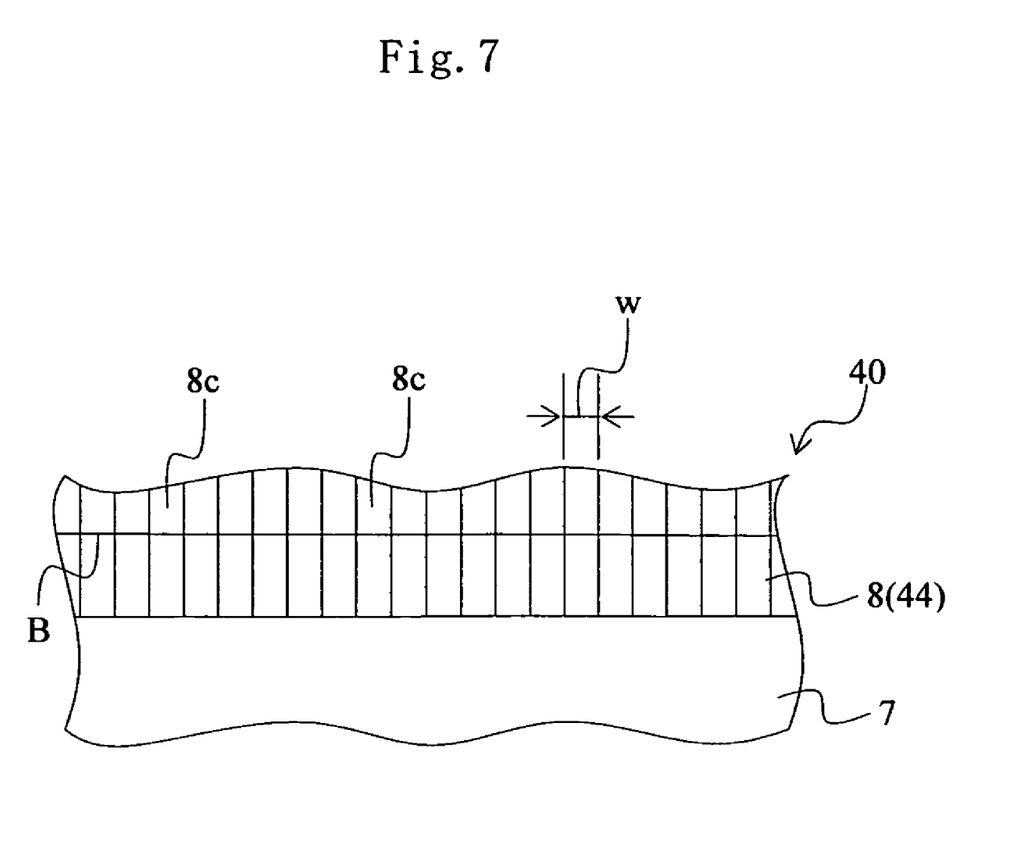
FIG. 7 is a schematic explanatory diagram for the sake of explaining a method for measuring a mean crystal width in the present invention.

A third preferred embodiment of a cutting tool will next be described in detail with reference to the accompanying drawings. FIG. 6 is a schematic sectional view illustrating a cutting tool according to the third preferred embodiment. FIG. 7 is a schematic explanatory diagram for the sake of explaining a method for measuring a mean crystal width. In FIGS. 6 and 7, the same reference numerals have been used as in FIGS. 1 to 5 for identical or similar components, and the description thereof has been left out of the following.

As shown in FIG. 6, a cutting tool 40 has a rake face 41 and a flank 42 that are formed on a substrate 7, and a cutting edge 43 is formed on a cross ridge portion between the rake face 41 and the flank 42. The surface of the substrate 7 is coated with a hard coating layer 44. The hard coating layer 44 is formed by a plurality of layers including a TiCN layer 8. Specifically, as in the foregoing preferred embodiment, an $Al_2O_3$ layer 45 is formed on the outer surface side of the TiCN layer 8. An intermediate layer 46 is formed between the TiCN layer 8 and the $Al_2O_3$ layer 45. As an under layer, a TiN layer 47 is formed on the surface of the substrate 7. Further, a TiN layer 48 is formed on the $Al_2O_3$ layer 45, namely as the surface layer of the hard coating layer 44.

The substrate 7 is composed of cemented carbide. Specifically, the substrate 7 is cemented carbide that can be obtained by binding a hard phase containing tungsten carbide (WC), and, as required, at least one selected from the group consisting of carbides, nitrides, and carbonitrides of the groups 4, 5, and 6 metals in the periodic table, by a binding phase of cobalt (Co) or nickel (Ni).

Strictly speaking, there is a difference between the force exerted to the rake face of a cutting tool and the force to the flank. Specifically, the rake face tends to be subject to stronger shock than the flank in interrupted cutting. On the other hand, the flank is subject to weaker shock than the rake face, but subject to strong rub with a work material in continuous cutting, so that the hard coating layer is apt to wear by this rub and friction. The hard coating layer is also apt to be flaked, and hence requires adherence to the substrate of the hard coating layer and, when the hard coating layer is formed by a plurality of layers, requires adherence between the layers.

On the contrary, in the cutting tool 40 of the third preferred embodiment a TiCN layer 8 is contained in a hard coating layer 44 that covers the surface of the substrate 7 composed of cemented carbide. The cutting tool 40 can exhibit excellent performance as a cutting tool by controlling the construction of the TiCN layer 8 so as to meet the performance required for the parts of a cutting tool.

In other words, the cutting tool 40 includes at least one TiCN layer 8 as the hard coating layer 44. A texture coefficient $T_{CR}$ of a (422)-crystal plane of the TiCN layer $8_R$ in the rake face 41 is larger than a texture coefficient $T_{CF}$ of a (422)-crystal plane of the TiCN layer $8_F$ in the flank 42, wherein a texture coefficient Tc of the (422)-crystal plane of the TiCN layer 8 is a value calculated by the following equation (I) in an X-ray diffraction analysis of the TiCN layer 8.

$$T_C = I_{(422)}/A \quad (I)$$

$$A: \frac{I_{(422)} + I_{(111)} + I_{(200)} + I_{(311)} + I_{(420)} + I_{(220)}}{6}$$

wherein $I_{(422)}$ is a peak strength of peaks that belong to the (422)-crystal plane; $I_{(111)}$ is a peak strength of peaks that belong to the (111)-crystal plane; $I_{(200)}$ is a peak strength of peaks that belong to the (200)-crystal plane; $I_{(311)}$ is a peak strength of peaks that belong to the (311)-crystal plane; $I_{(420)}$ is a peak strength of peaks that belong to the (420)-crystal plane; and $I_{(220)}$ is a peak strength of peaks that belong to the (220)-crystal plane.

Thereby, on the rake face 41 side, the shock resistance of the hard coating layer 44 is enhanced. On the flank 42 side, the adherence between the TiCN layer 8 and the substrate 7, and the adherence between the TiCN layer 8 and other coating layer of the hard coating layer 44 are enhanced than that of the rake face 41 side. This enables to prevent layer flaking, and abnormal wear associated therewith, thereby enhancing the wear resistance of the hard coating layer 44. It is therefore possible to achieve the layer construction to meet the performance required for the rake face 41 and the performance required for the flank 42. This enables the cutting tool 40 to exhibit excellent wear resistance and excellent fracture resistance with respect to interrupted cutting and continuous cutting.

On the contrary, when the texture coefficient $T_{CR}$ of the rake face 41 is smaller than or equal to the texture coefficient $T_{CF}$ of the flank 42, the rake face 41 side of the cutting tool 40 may cause chipping or fracture, or the flank 42 side may cause layer flaking, and abnormal wear associated therewith may proceed, shortening the tool life of the cutting tool 40.

In particular, a ratio of the texture coefficient $T_{CR}$ of the rake face 41 to the texture coefficient $T_{CF}$ of the flank 42, ($T_{CR}/T_{CF}$), is desirably in the range of 1.1 to 2.5. As a result, on the rake face 41 side, the shock resistance of the TiCN layer 8 is enhanced. On the flank 42 side, the adherence between the TiCN layer 8 and the substrate 7, and the adherence between the TiCN layer 8 and other coating layer of the hard coating layer 44 are enhanced than that of the rake face 41. Consequently, the shock resistance and wear resistance of the cutting tool 40 can be optimized.

Additionally, it is desirable that a binding phase amount BF in the outer surface $7_F$ of the substrate 7 in the flank 42 be less than a binding phase amount $B_R$ in the outer surface $7_R$ of the substrate 7 in the rake face 41, namely to satisfy the relationship of $B_F<B_R$. As a result, during the time of forming the TiCN layer 8, there occur differences in layer forming state between the rake face 41 and the flank 42. Therefore, it is easy for the TiCN layer $8_R$ of the rake face 41 to be oriented on the (422)-crystal plane, while it is hard for the TiCN layer $8_F$ of the flank 42 to be oriented on the (422)-crystal plane. As a result, the crystal orientation of the TiCN layer 8 can be controlled within the above-mentioned range, achieving excellent fracture resistance and wear resistance. Preferably, $B_R/B_F$ is in the range of 1.2 to 3.5.

In particular, it is desirable that a ratio of the above binding phase amount $B_F$ to a binding phase amount $B_I$ in the interior of the substrate 7, namely ($B_F/B_I$), be 0.6 to 0.9; and that a ratio of the above binding phase amount $B_R$ to the binding phase amount $B_I$, namely ($B_R/B_I$), be 1.1 to 1.6. Thereby, the growth state of TiCN particles in the TiCN layer $8_R$ of the rake face 41 and in the TiCN layer $8_F$ of the flank 42 can be controlled in a predetermined range, achieving excellent fracture resistance and wear resistance.

The biding phase amounts $B_F$ and $B_R$ in the outer surfaces $7_F$ and $7_R$ of the substrate 7, respectively, and the binding phase amount $B_I$ in the interior of the substrate 7 can be measured by a surface analysis method such as X-ray microanalyzer (electron probe micro-analysis (EPMA)), auger electron spectroscopy (AES).

The binding phase amounts in the outer surfaces of the substrate in the rake face and the flank can be measured in the region not more than 1.5 μm deep from the interface on the outer surface side of the substrate toward the interior of the substrate in the rake face and the flank. The binding phase amount in the interior of the substrate can be measured in the region not less than 500 μm deep from the outer surface of the substrate toward the interior of the substrate.

Preferably, the TiCN layer 8 is composed of an aggregate of TiCN particles in a columnar shape extending vertically with respect to the outer surfaces $7_F$ and $7_R$ of the substrate 7, and a ratio ($w_R/w_F$) is 0.4 to 0.8, wherein $w_R$ is a mean crystal width in the direction orthogonal to the direction of layer thickness of the TiCN particles in the columnar shape in the rake face 41; and $w_F$ is a mean crystal width of the TiCN particles in the columnar shape in the flank 42. This enables to optimize the wear resistance and fracture resistance in the rake face 41 and the flank 42. In particular, the toughness and the hardness of the TiCN layer 8 can be improved, achieving excellent fracture resistance and wear resistance of the cutting tool 40.

It is extremely desirable that the mean crystal width ($w_R$, $w_F$) of each TiCN particle in the columnar shape be 0.1 to 1.0 μm, in order to enhance the shock resistance of the TiCN layer 8 and the hard coating layer 44. The mean crystal widths $w_R$ and $w_F$ are an average value obtained as follows. As shown in FIG. 7, using intercept method, measurements are made of the number of grain boundaries that cross over a segment B at five locations of an arbitrary broken-out section containing the TiCN layer 8 of the hard coating layer 44 in the cutting tool 40. Based on the obtained number of particles and the length of the segment B, five values converted to a crystal width w of the TiCN particle 8c in the columnar shape are averaged.

It is desirable that a ratio of a layer thickness $t_R$ of the TiCN layer $8_R$ in the rake face 41 to a layer thickness $t_F$ of the TiCN layer $8_F$ in the flank 42, namely ($t_R/t_F$), be 0.8 to 1.2. Within this range, the TiCN layers $8_R$ and $8_F$ allow for well-balanced exhibition of their respective excellent characteristics. Specifically, the fracture resistance of the rake face 41 and the wear resistance of the flank 42 can be optimized. Each layer thickness ($t_R$, $t_F$) herein stands for an average value of layer thickness at arbitrary five locations in each layer.

When the layer thickness of the TiCN layer 8 of the cutting tool 40 is 3 μm to 20 μm, fracture resistance and wear resistance as a cutting tool are compatible. Specifically, on the rake face 41 side, shock resistance is ensured. On the flank 42, the adherence between the TiCN layer 8 and the substrate 7, and the adherence between the TiCN layer 8 and other coating layer of the hard coating layer 44 are higher than that of the rake face 41, and the wear resistance of the hard coating layer 44 is enhanced. Moreover, when the layer thicknesses of the TiCN layers $8_R$ and $8_F$ fall within the above-mentioned range, the texture coefficient ratio ($T_{CR}/T_{CF}$) of the TiCN layers $8_R$ and $8_F$ can be controlled reliably within the above-mentioned range.

The following is a method for manufacturing the cutting tool 40. First, a substrate 7 is manufactured. Specifically, metal powder, carbon powder, or the like are added to and mixed with inorganic powder such as metal carbide, nitride, carbonitride, oxide, which can form the above-mentioned cemented carbide by sintering. Subsequently, with a known forming method such as press forming, casting forming, extrusion forming, or cold isostatic hydraulic press forming, this mixture is then formed in a predetermined tool shape and sintered after holding in vacuum or nonoxidizing atmosphere at 1500° C. to 1550° C. for 1 to 1.5 hours.

In the third preferred embodiment, after sintering at the aforesaid sintering temperatures, there is held for 5 minutes to 10 minutes at a temperature of 30° C. to 50° C. above the aforesaid sintering temperature. Alternatively, after sintering at the aforesaid sintering temperature and then cooling, the sintering is terminated once, followed by heat treatment of holding for five minutes to ten minutes at a temperature of 30° C. to 50° C. above the aforesaid sintering temperature. This produces a substrate 7 that has, on the surface of the substrate 7, a binding phase poor layer, from which binding phases have been evaporated, and has, immediately below (inside) the binding phase poor layer, a binding phase rich layer having a larger binding phase content than the interior of the substrate 7.

Subsequently, the binding phase poor layer existing in the surface of the rake face 41 of the substrate 7 is removed, desirably allowing the binding phase rich layer to remain, followed by polishing process such that the binding phase rich layer is exposed to the surface of the substrate 7 of the rake face 41. This enables control such that the binding phase content in the outer surface $7_R$ of the rake face 41 of the substrate 7, and that in the outer surface $7_F$ of the flank 42 of the substrate 7 fall in a predetermined range ($B_R > B_F$). This also enables to control the crystal growth state of the TiCN layer 8 on the rake face 41 side and on the flank 42 side when forming the TiCN layer 8 to be described later. Moreover, removing the binding phase poor layer with polishing process can enhance the smoothness of the rake face 41.

Next, a hard coating layer 44 is formed on the surface of the substrate 7 with chemical vapor deposition (CVD) method. If desired, a TiN layer 47 as an under layer is formed. Specific forming conditions are as follows. As a reaction gas composition, a mixed gas consisting of 0.1 to 10 vol. % of $TiCl_4$ gas, 30 to 60 vol. % of nitrogen ($N_2$) gas, and the rest, namely $H_2$ gas, is prepared and then introduced into a reaction reactor at 800 to 1100° C. and 5 to 85 kPa.

Subsequently, a TiCN layer 8 is formed. Specific forming conditions are as follows. As a reaction gas composition, a mixed gas consisting of 1.5 to 10 vol. % of $TiCl_4$ gas, 30 to 80 vol. % of $N_2$ gas, 0.1 to 1 vol. % of $CH_3CN$ gas, and the rest, namely $H_2$ gas, is prepared and then introduced into a reaction reactor at 780 to 1000° C. and 5 to 85 kPa.

Like the foregoing preferred embodiment, among the above forming conditions, the ratio ($TiCl_4$ gas/$CH_3CN$ gas) of the flow rate of $TiCl_4$ gas to the flow rate of $CH_3CN$ gas in the reaction gas at the initial stage of forming the TiCN layer 8 and the ratio ($TiCl_4$ gas/$CH_3CN$ gas) in the reaction gas at the later stage of forming the TiCN layer 8 may have predetermined relationship.

Preferably, the flow rate of nitrogen gas at the initial stage of layer formation is 5 to 45 vol. %, and the flow rate at the later stage is two times that at the initial stage. Preferably, the layer forming temperature at the initial stage is 830 to 1000° C., and the layer forming temperature at the later stage is 780 to 900° C., desirably lower than that at the initial stage by not less than 50° C. Preferably, the above-mentioned forming conditions are gradually changed.

If desired, an intermediate layer 46 is then formed. For example, when a TiCNO layer is formed as the intermediate layer 46, it may be formed in the same manner as in the case with the intermediate layer 26 in the foregoing first preferred embodiment.

Subsequently, it is desired to form an $Al_2O_3$ layer 45 under conditions of 900 to 1100° C. and 5 to 10 kPa by using a mixed gas consisting of 3 to 20 vol. % of $AlCl_3$ gas, 0.5 to 3.5 vol. % of HCl gas, 0.01 to 5.0 vol. % of $CO_2$ gas, 0 to 0.5 vol. % of $H_2S$ gas, and the rest, namely $H_2$ gas.

If desired, a TiN layer 48 as a surface layer is then formed. Specifically, as a reaction gas composition, a mixed gas consisting of 0.1 to 10 vol. % of $TiCl_4$ gas, 40 to 60 vol. % of $N_2$ gas, and the rest, namely $H_2$ gas, is prepared and then introduced into a reaction reactor at 800 to 1100° C. and 5 to 85 kPa.

<Manufacturing Method of Work Piece>

A method for manufacturing a work piece of the present invention is to manufacture one that performs cutting process by applying a cutting edge formed on a cross ridge portion between a rake face and a flank of a cutting tool to a work material. This enables a work piece having a superior processing surface to be obtained stably.

The present invention is not limited to the above-mentioned preferred embodiments. Although the foregoing has discussed the case of using chemical vapor deposition (CVD) method as a layer forming method, part of or all of a hard coating layer may be formed by physical vapor deposition (PVD) method. For example, even if a TiCN layer is formed by ion plating method, a tool having excellent fracture resistance and further excellent wear resistance can be manufactured by controlling the construction of the TiCN layer to the above-mentioned range.

Examples of the present invention will be described below. It is understood, however, that the examples are for the purpose of illustration and the invention is not to be regarded as limited to any of the specific materials or condition therein.

EXAMPLES

Example 1

<Manufacturing of Cutting Tool>

To tungsten carbide (WC) powder having a mean particle size of 1.5 μm, 6 mass % of metal cobalt (Co) powder having a mean particle size of 1.5 μm, 0.5 mass % of titanium carbide (TiC) powder having a mean particle size of 2.0 μm, and 1 mass % of TaC powder were added and mixed, followed by press forming into a cutting tool shape (CNMA120412). This was then subjected to debinding process, and sintered in vacuum of 0.01 Pa at 1500° C. for one hour, thereby manufacturing cemented carbide (substrate). The cemented carbide was further subjected to cutting edge treatment (honing R) from a rake face by brushing. The arithmetic mean roughness (Ra) according to JISB0601-2001 in a flank of the substrate so obtained was 1.1 μm, and the arithmetic mean roughness (Ra) in the rake face was 0.4 μm.

Then, on the surface of the substrate so obtained, a hard coating layer composed of a plurality of layers having the composition as shown in Table 1 was formed with CVD method. The layer forming conditions of the respective layers in Table 1 are presented in Table 2. The surface of the hard coating layer was then subjected to brushing from the rake face side for 30 seconds, thereby manufacturing cutting tools of Samples Nos. I-1 to I-6, respectively, as shown in Table 1.

TABLE 1

| Sample No. | Coating layer[Note 1] | | | | | | $r_R$[Note 2] $r'_R$[Note 3] | | | $r_F$[Note 4] $r'_F$[Note 5] | | |
|---|---|---|---|---|---|---|---|---|---|---|---|---|
| | Under layer | TiCN layer | | Intermediate layer | $Al_2O_3$ layer | Surface layer | $r_{AR}$ | Center | $r_{BR}$ | $r_{AF}$ | Center | $r_{BF}$ |
| I-1 | TiN (0.5) | TiCN① (9) | — | TiCNO (0.2) | — | α-$Al_2O_3$ (2.0) | TiN (0.5) | 0.5 1 | 1 1.5 | 1.5 1.8 | 0.25 1.1 | 0.5 1.4 | 0.75 2.0 |
| I-2 | TiN (3) | TiCN① (5) | TiCN⑤ (3) | TiC (1) | TiNO (0.01) | α-$Al_2O_3$ (4.0) | TiN (0.4) | 0.5 1 | 1 1.5 | 3 0.3 | 0.26 0.9 | 0.5 1.5 | 1.4 0.5 |
| I-3 | — | TiCN① (7) | — | TiC (2) | — | κ-$Al_2O_3$ (5.0) | — | 0.8 1 | 0.9 1.4 | 1.3 1.7 | 0.25 1.2 | 0.45 1.6 | 0.5 1.9 |
| I-4 | TiN (0.01) | TiCN② (3) | TiCN③ (7) | — | — | — | — | 0.1 1 | 3 1 | 3 1 | 0.07 1 | 1.5 1.2 | 1.5 1.1 |
| *I-5 | TiN (0.5) | TiCN④ (7) | — | TiC (2) | TiCNO (0.2) | α-$Al_2O_3$ (3.0) | TiN (0.5) | 0.4 1 | 0.35 1.3 | 0.3 1.5 | 0.4 1.1 | 0.35 1.3 | 0.3 1.7 |
| *I-6 | — | TiCN⑤ (6) | — | TiC (1) | — | κ-$Al_2O_3$ (3.0) | TiN (0.5) | 3 0.3 | 3 0.3 | 3 0.3 | 3 0.3 | 3 0.3 | 3 0.3 |

| | | | Cutting evaluation | | | |
|---|---|---|---|---|---|---|
| Sample No. | $r_{AR}/r_{AF}$ | $r_{BR}/r_{BF}$ | Adhesion (N) | Flank wear (mm) | Chipping of hard layer (piece) | Number of flaking pieces (piece) |
| I-1 | 2 | 2 | 100 | 0.14 | 0/5 | 0/5 |
| I-2 | 1.9 | 2.1 | 95 | 0.16 | 0/5 | 0/5 |
| I-3 | 3.2 | 2.6 | 105 | 0.15 | 0/5 | 0/5 |
| I-4 | 1.4 | 2 | 100 | 0.18 | 0/5 | 0/5 |
| *I-5 | 1 | 1 | 70 | 0.25 | 1/5 | 2/5 |
| *I-6 | 1 | 1 | 50 | 0.35 | 3/5 | 5/5 |

The samples marked "*" are out of the scope of the present invention.
[Note 1] Figures put in parentheses ( ) represent layer thickness (unit: μm).
[Note 2] $r_R$: Ratio of peak strength (422)/(111) in the rake face of TiCN layer in XRD
[Note 3] $r'_R$: Ratio of peak strength (311)/(220) in the rake face of TiCN layer in XRD
[Note 4] $r_F$: Ratio of peak strength (422)/(111) in the flank of TiCN layer in XRD
[Note 5] $r'_F$: Ratio of peak strength (311)/(220) in the flank of TiCN layer in XRD

TABLE 2

| Coating layer | Mixed gas composition (vol. %) | Reactor temperature (° C.) | Pressure (kPa) |
|---|---|---|---|
| Under layer (TiN) | $TiCl_4$: 2.0, $N_2$: 44, $H_2$: the rest | 900 | 16 |
| TiCN(1)* | $TiCl_4$: 2.0, $N_2$: 33→66, $CH_3CN$: 0.4→0.2, $H_2$: the rest | 865→800 | 9 |
| TiCN(2) | $TiCl_4$: 2.5, $N_2$: 23, $CH_3CN$: 0.9, $H_2$: the rest | 900 | 9 |
| TiCN(3) | $TiCl_4$: 1.0, $N_2$: 80, $CH_3CN$: 0.1, $H_2$: the rest | 850 | 9 |
| TiCN(4) | $TiCl_4$: 4, $CH_3CN$: 3, $H_2$: the rest | 1000 | 8 |
| TiCN(5) | $TiCl_4$: 11, $CH_3CN$: 1, $H_2$: the rest | 780 | 7 |
| TiC | $TiCl_4$: 2, $CH_4$: 11, $H_2$: the rest | 1010 | 10 |
| TiCNO | $TiCl_4$: 1.5, $CH_4$: 3.4, $N_2$: 27, $CO_2$: 1.0, $H_2$: the rest | 1010 | 10 |
| TiNO | $TiCl_4$: 1.5, $N_2$: 27, $CO_2$: 1.0, $H_2$: the rest | 1010 | 10 |
| $Al_2O_3$ | $AlCl_3$: 15, HCl: 2, $CO_2$: 4, $H_2S$: 0.4, $H_2$: the rest | 1005 | 6 |
| Surface layer (TiN) | $TiCl_4$: 2.0, $N_2$: 44, $H_2$: the rest | 1010 | 80 |

*TiCN(1): Mixed gas composition ($N_2$ amount, $H_2$ amount, $CH_3CN$ amount) and reactor temperature were continuously changed.

The TiCN layer existing in the rake face and the flank of each of the cutting tools so obtained was subjected to brushing so as to be polished in their respective predetermined thicknesses, and each X-ray diffraction measurement was made to conduct identification and quantification of peaks. The X-ray diffraction measurement was made with Cu—K α rays at a voltage of 40 kV and a current of 40 mA, and data obtained after conducting K α rays removing process was used in a diffraction chart.

In Table 1, "$r_{AR}$" is a ratio r when an X-ray diffraction analysis was conducted in a state in which a region extending in a thickness of 0.5 μm to 1.5 μm from the interface on the inner surface side was exposed in the TiCN layer existing in the rake face; and "$r_{AF}$" is a ratio r when an X-ray diffraction analysis was conducted in a state in which the region extending in a thickness of 0.5 μm to 1.5 μm from the interface on the inner surface side was exposed in the TiCN layer existing in the flank. In Table 1, "$r_{BR}$" is a ratio r when an X-ray diffraction analysis was conducted in a state in which a region extending in a thickness of 0.5 μm to 1.5 μm from the interface on the outer surface side was exposed in the TiCN layer existing in the rake face; and "$r_{BF}$" is a ratio r when an X-ray diffraction analysis was conducted in a state in which the region extending in a thickness of 0.5 μm to 1.5 μm from the interface on the outer surface side was exposed in the TiCN layer existing in the flank.

<Evaluation>

The respective cutting tools of Samples Nos. I-1 to I-6 were evaluated in adhesion and cutting. These evaluations were made in the following manners. The results are presented in Table 1.

[Adhesion]

A scratch test was conducted under the following conditions. Scratching traces were observed to check interlayer flaking state, and a load under which the hard coating layer came off was confirmed, and adhesion was calculated.
Apparatus: CSEM-REVETEST manufactured by Nanotech Co., Ltd.
Measuring Conditions:
Table speed: 0.17 mm/sec.
Load speed: 100 N/min (continuous load)
Scratching distance: 5 mm
Indenter:
Conical diamond indenter (N-2-1487, a diamond contact manufactured by Tokyo Diamond Kogu Seisakusho Co., Ltd.)
Radius of curvature: 0.2 mm
Edge angle: 120°

[Cutting Evaluation]

As a cutting evaluation, wear resistance and fracture resistance were evaluated by conducting a continuous cutting test and an interrupted cutting test under the following conditions.

(Continuous Cutting Conditions)
Work material: Ductile cast iron sleeve material with four grooves
(FCD700)
Tool shape: CNMA120412
Cutting speed: 250 m/min
Feed rate: 0.3 mm/rev
Depth of cut: 2 mm
Cutting time: 20 minutes
Others: Employment of water soluble cutting solution
Evaluation item: Flank wear amount was determined by observing the cutting edge under a microscope.

(Interrupted Cutting Conditions)
Work material: Ductile cast iron sleeve material with four grooves
(FCD700)
Tool shape: CNMA120412
Cutting speed: 250 m/min
Feed rate: 0.3 to 0.5 mm/rev
Depth of cut: 2 mm
Others: Employment of water soluble cutting solution
Evaluation item: The number of shocks to reach fracture; After applying 1000 shocks, the flaking state of the hard coating layer of the cutting edge was observed under a microscope.

It will be noted from Tables 1 and 2 that Sample No. I-5, whose ratio r ($I_{(422)}/I_{(111)}$) on the outer surface side was smaller than that on the inner surface side, had poor fracture resistance because layer flaking caused chipping, and caused a large amount of flank wear in the continuous cutting. Sample No. I-6, the outer surface side and the inner surface side of which have the same r ($I_{(422)}/I_{(111)}$), caused a large amount of layer flaking in the interrupted cutting, and had poor wear resistance in the continuous cutting.

Conversely, Samples Nos. I-1 to I-4, whose ratio r ($I_{(422)}/I_{(111)}$) on the outer surface side was larger than that on the inner surface side according to present invention, caused no flaking of the hard coating layer in the interrupted cutting, and further increased the endurance number of shocks in the interrupted cutting test. These samples had a long tool life in the continuous cutting and the interrupted cutting, and achieved cutting performance excellent in fracture resistance and chipping resistance.

Example 2

<Manufacturing of Cutting Tool>

In the same manner as in EXAMPLE 1, a substrate was obtained in which a flank had an arithmetic mean roughness (Ra) of 1.1 μm, and a rake face had an arithmetic mean roughness (Ra) of 0.4 μm.

Then, on the surface of the substrate so obtained, a hard coating layer composed of a plurality of layers having the composition as shown in Table 3 was formed with CVD method. The layer forming conditions of the respective layers in Table 3 are presented in Table 4. The surface of the hard coating layer was then subjected to brushing from the rake face side of the hard coating layer for 30 seconds, thereby manufacturing cutting tools of Samples Nos. II-1 to II-6, respectively, as shown in Table 3.

TABLE 3

| Sample No. | Coating layer[Note 1] | | | | | | Maximum peak of TiN layer as first layer TiN(hkl) | Maximum peak on the inner surface side of TiCN layer |
|---|---|---|---|---|---|---|---|---|
| | Under layer (First layer) | TiCN layer | Intermediate layer | | $Al_2O_3$ layer | Surface layer | | |
| II-1 | TiN1 (0.5) | TiCN1 (9) | — | TiCNO (0.2) | — | α-$Al_2O_3$ (2.0) | TiN4 (0.5) | 111 | 111 |
| II-2 | TiN1 (3) | TiCN1 (5) | TiCN5 (3) | TiC (1) | TiNO (0.01) | α-$Al_2O_3$ (4.0) | TiN4 (0.4) | 111 | 111 |
| II-3 | TiN2 (0.01) | TiCN2 (3) | TiCN3 (7) | — | — | — | — | 200 | 200 |
| II-4 | TiN2 (2) | TiCN6 (4) | TiCN3 (7) | — | — | κ-$Al_2O_3$ (3.0) | TiN4 (2) | 200 | 422 |
| *II-5 | TiN3 (0.5) | TiCN4 (7) | — | TiC (2) | TiCNO (0.2) | α-$Al_2O_3$ (3.0) | TiN4 (0.5) | 200 | 311 |
| *II-6 | TiN1 (0.5) | TiCN5 (6) | — | TiC (1) | — | κ-$Al_2O_3$ (3.0) | TiN4 (0.5) | 111 | 422 |

| Sample No. | $R_R$[Note 2] $R_R'$[Note 3] $R_R''$[Note 4] | | | $R_{AR}/R_{AF}$ | $R_{BR}/R_{BF}$ | Adhesion (N) | Cutting evaluation | | |
|---|---|---|---|---|---|---|---|---|---|
| | Inner surface side $R_{AR}$ | Center | Outer surface side $R_{BR}$ | | | | Flank wear (mm) | Chipping of hard layer (piece) | Number of flaking pieces (piece) |
| II-1 | 0.3 / 1 / 0.4 | 1 / 1.5 / 0.8 | 1.5 / 1.8 / 1.2 | 1.2 | 2 | 120 | 0.15 | 0/5 | 0/5 |
| II-2 | 0.3 / 1 / 0.4 | 1 / 1.5 / 0.8 | 3 / 0.3 / 4 | 1.2 | 2 | 130 | 0.14 | 0/5 | 0/5 |
| II-3 | 0.5 / 1 / 0.5 | 2 / 1 / 2 | 2 / 1 / 2 | 2 | 9 | 125 | 0.17 | 0/5 | 0/5 |
| II-4 | 1.5 / 1 / 1.5 | 2 / 1 / 2 | 2 / 1 / 2 | 5 | 10 | 115 | 0.16 | 0/5 | 0/5 |
| *II-5 | 0.4 / 1 / 0.4 | 0.35 / 1.3 / 0.35 | 0.3 / 1.5 / 0.3 | 1 | 1 | 70 | 0.25 | 2/5 | 2/5 |
| *II-6 | 3 / 0.3 / 4 | 3 / 0.3 / 4 | 3 / 0.3 / 4 | 1 | 1 | 50 | 0.35 | 5/5 | 5/5 |

The samples marked "*" are out of the scope of the present invention.

[Note 1] Figures put in parentheses ( ) represent layer thickness (unit: μm).
[Note 2] $R_{AR}$: Ratio of peak strength (422)/(hkl) of TiCN layer in XRD (hkl) peak is the maximum peak of TiN layer as the first layer.
[Note 3] $R_{AR}'$: Ratio of peak strength (311)/(220) of TiCN layer in XRD
[Note 4] $R_{AR}''$: Ratio of peak strength (422)/(200) of TiCN layer in XRD

TABLE 4

| Coating layer | Mixed gas composition (vol. %) | Reactor temperature (° C.) | Pressure (kPa) |
|---|---|---|---|
| Under layer (TiN1) | $TiCl_4$: 2.0, $N_2$: 33, $H_2$: the rest | 865 | 16 |
| Under layer (TiN2) | $TiCl_4$: 2.5, $N_2$: 23, $H_2$: the rest | 900 | 16 |
| Under layer (TiN3) | $TiCl_4$: 2.0, $N_2$: 44, $H_2$: the rest | 900 | 16 |

TABLE 4-continued

| Coating layer | Mixed gas composition (vol. %) | Reactor temperature (° C.) | Pressure (kPa) |
|---|---|---|---|
| TiCN1* | $TiCl_4$: 2.0, $N_2$: 33→66, $CH_3CN$: 0.4→0.2, $H_2$: the rest | 865→800 | 9 |
| TiCN2 | $TiCl_4$: 2.5, $N_2$: 23, $CH_3CN$: 0.9, $H_2$: the rest | 900 | 9 |
| TiCN3 | $TiCl_4$: 1.0, $N_2$: 80, $CH_3CN$: 0.1, $H_2$: the rest | 850 | 9 |
| TiCN4 | $TiCl_4$: 4, $CH_3CN$: 3, $H_2$: the rest | 1000 | 8 |
| TiCN5 | $TiCl_4$: 11, $CH_3CN$: 1, $H_2$: the rest | 780 | 7 |
| TiCN6 | $TiCl_4$: 2.5, $N_2$: 23, $CH_3CN$: 0.2, $H_2$: the rest | 850 | 10 |
| TiCNO | $TiCl_4$: 1.5, $CH_4$: 3.4, $N_2$: 27, $CO_2$: 1.0, $H_2$: the rest | 1010 | 10 |
| TiNO | $TiCl_4$: 1.5, $N_2$: 27, $CO_2$: 1.0, $H_2$: the rest | 1010 | 10 |
| $Al_2O_3$ | $AlCl_3$: 15, HCl: 2, $CO_2$: 4, $H_2S$: 0.4, $H_2$: the rest | 1005 | 6 |
| Surface layer (TiN4) | $TiCl_4$: 2.0, $N_2$: 44, $H_2$: the rest | 1010 | 80 |

*TiCN1: Mixed gas composition ($N_2$ amount, $H_2$ amount, $CH_3CN$ amount) and reactor temperature were continuously changed.

The TiCN layer existing in the rake face and the flank of each of the cutting tools so obtained was subjected to brushing (using diamond abrasive grains) so as to be polished in their respective predetermined thicknesses. In the same manner as in EXAMPLE 1, each X-ray diffraction measurement was made to conduct identification and quantification of peaks.

In Table 3, "$R_{AR}$" is a ratio R when an X-ray diffraction analysis was conducted in a state in which a region extending in a thickness of 0.5 μm to 1.5 μm from the interface on the inner surface side was exposed in the TiCN layer existing in the rake face; and "$R_{AF}$" is a ratio R when an X-ray diffraction analysis was conducted in a state in which the region extending in a thickness of 0.5 μm to 1.5 μm from the interface on the inner surface side was exposed in the TiCN layer existing in the flank. In Table 3, "$R_{BR}$" is a ratio R when an X-ray diffraction analysis was conducted in a state in which a region extending in a thickness of 0.5 μm to 1.5 μm from the interface on the outer surface side was exposed in the TiCN layer existing in the rake face; and "$R_{BF}$" is a ratio R when an X-ray diffraction analysis was conducted in a state in which a region extending in a thickness of 0.5 μm to 1.5 μm from the interface on the outer surface side was exposed in the TiCN layer existing in the flank.

<Evaluation>

The respective cutting tools of Samples Nos. II-1 to II-6 were evaluated in adhesion and cutting in the same manner as in EXAMPLE 1. The results are presented in Table 3.

It will be noted from Tables 3 and 4 that Sample No. II-5, whose ratio R ($I_{(422)}/I_{(111)}$) on the outer surface side was smaller than that on the inner surface side, had poor fracture resistance because layer flaking caused chipping, and had a large amount of wear of the flank in the continuous cutting. Sample No. II-6, the outer surface side and the inner surface side of which have the same R ($I_{(422)}/I_{(111)}$), caused a large amount of layer flaking in the interrupted cutting, and had poor wear resistance in the continuous cutting.

On the contrary, Sample Nos. II-1 to II-4, whose ratio R ($I_{(422)}/I_{(111)}$) on the outer surface side was larger than that on the inner surface side, caused no flaking of the hard coating layer in the interrupted cutting, and further increased the endurance number of shocks in the interrupted cutting test. These samples had a long tool life in the continuous cutting and the interrupted cutting, and achieved cutting performance excellent in fracture resistance and chipping resistance.

Example 3

<Manufacturing of Cutting Tool>

Tungsten carbide (WC) powder having a mean particle size of 1.5 μm, metal cobalt (Co) powder having a mean particle size of 1.2 μm, and raw material powders shown in Table 5 (TiC, TiN, TaC, ZrC, and NbC) having a mean particle size of 2.0 μm were added and mixed in the proportions shown in Table 5, followed by press forming into a cutting tool shape (CNMG120408). This was then subjected to debinding process, and sintered in vacuum of 0.01 Pa under the conditions shown in Table 5, while raising the temperature at a speed of 3° C./min in a temperature range of 1000° C. and above. This was further subjected to heat treatment and then cooling under the conditions shown in Table 5, thereby manufacturing a substrate composed of cemented carbide having in its surface a binding phase poor layer and a binding phase rich layer.

After the substrate so obtained was polished so as to be in a state shown in Table 5, a hard coating layer having a layer construction of Table 7 was formed by CVD method under the layer forming conditions shown in Table 6, thereby manufacturing a cutting tool (Samples Nos. III-1 to III-6 in Table 7).

In Table 7, $r_{AR}$, $r_{AF}$, $r_{BR}$ and $r_{BF}$ were measured in the same manner as in EXAMPLE 1. $R_{AR}$, $R_{AF}$, $R_{BR}$ and $R_{BF}$ in Table 7 were measured in the same manner as in EXAMPLE 2.

As for the cutting tools so obtained, the binding phase amounts $B_F$ and $B_R$ in the outer surface of the substrate in the flank and the rake face, and the binding phase amount $B_I$ in the interior of the substrate were measured. The results were presented in Table 5.

On the surface of the hard coating layer in the rake face and the flank, each X-ray diffraction measurement was made to determine texture coefficients $T_{CR}$ and $T_{CF}$. A ratio ($T_{CR}/T_{CF}$) is presented in Table 8. Under a scanning microscope, the section including the hard coating layer was observed to determine the layer thickness of the respective layers of the rake face. As to the TiCN layer, the layer thickness of the flank was also determined. A ratio of a layer thickness of the rake face $t_R$ to a layer thickness of the flank $t_F$, namely ($t_R/t_F$), is presented in Table 8. Mean crystal widths $w_R$ and $w_F$ in the direction orthogonal to the layer thickness direction of columnar TiCN particles in the rake face and in the flank were calculated. The ratio ($w_R/w_F$) is presented in Table 8.

<Evaluation>

The respective cutting tools of Samples Nos. III-1 to III-6 were evaluated in adhesion and cutting in the following manner. The results are presented in Table 7.

[Adhesion]

Evaluation was made in the same manner as EXAMPLE 1.

[Cutting Evaluation]

As a cutting evaluation, a wear test and a fracture resistance test were conducted under the following conditions, in order to evaluate wear resistance and fracture resistance.

(Wear Test)
Work material: Chrome molybdenum steel (SCM435)
Tool shape: CNMG120408
Cutting speed: 300 m/min
Feed rate: 0.3 mm/rev
Depth of cut: 2 mm
Others: Employment of water soluble cutting solution
Cutting time: 12.5 minutes
Evaluation item: At the completion of cutting, the state of the cutting edge was observed. Flank wear amount of the flank was determined (Only Sample No. III-4 with a rapid progress of wear had a cutting time of 9.5 minutes).

(Fracture Resistance Test)
Work material: Chrome molybdenum steel (SCM440) with four grooves
Tool shape: CNMG120408
Cutting speed: 300 m/min
Feed rate: 0.3 mm/rev
Depth of cut: 1.5 mm
Others: Employment of water soluble cutting solution
Evaluation item: The number of shocks to reach fracture (Provided the maximum number of shocks was 3000)

TABLE 5

| Sample No. | Composition of substrate (mass %) | | | | | | | Sintering Temp. (°C.) | Sintering Time (hour) | Heat treatment Temp. (°C.) | Heat treatment Time (min.) | Polishing Processed surface | Amount of polishing (μm) | Surface binding phase amount | | |
|---|---|---|---|---|---|---|---|---|---|---|---|---|---|---|---|---|
| | WC | TiC | TiN | TaC | ZrC | NbC | Co | | | | | | | $B_R/B_F$ | $B_F/B_I$ | $B_R/B_I$ |
| III-1 | 86.0 | 0.5 | 1.0 | 3.0 | 1.0 | 1.5 | 7.0 | 1500 | 1 | 1530 | 5 | Rake face | 5 | 1.6 | 0.8 | 1.3 |
| III-2 | 86.5 | 1.0 | 1.0 | 3.0 | 1.0 | 1.5 | 6.0 | 1550 | 1 | 1580 | 10 | Rake face | 10 | 2.0 | 0.6 | 1.2 |
| *III-3 | 86.0 | 1.0 | 0.5 | 3.5 | 0.0 | 1.0 | 8.0 | 1480 | 2 | — | | Rake face | 50 | 0.9 | 1.1 | 1 |
| *III-4 | 86.0 | 1.0 | 0.0 | 4.0 | 1.0 | 0.0 | 8.0 | 1500 | 1 | 1590 | 30 | Rake face | 5 | 1.0 | 1 | 1 |
| *III-5 | 88.0 | 1.5 | 1.0 | 0.0 | 1.5 | 3.0 | 5.0 | 1500 | 1 | 1530 | 5 | — | | 1.0 | 0.7 | 0.7 |
| *III-6 | 88.0 | 2.0 | 1.0 | 1.5 | 1.0 | 1.5 | 5.0 | 1550 | 1 | 1600 | 10 | All surfaces | 100 | 1.0 | 1 | 1 |

The samples marked "*" are out of the scope of the present invention.

TABLE 6

| Coating layer | Mixed gas composition (vol. %) | Reactor temperature (°C.) | Pressure (kPa) |
|---|---|---|---|
| TiN layer as under layer | $TiCl_4$: 2.0, $N_2$: 44, $H_2$: the rest | 900 | 16 |
| TiCN1* | $TiCl_4$: 2.0, $N_2$: 33→66, $CH_3CN$: 0.4→0.2, $H_2$: the rest | 865→800 | 9 |
| TiCN2 | $TiCl_4$: 2.5, $N_2$: 23, $CH_3CN$: 0.9, $H_2$: the rest | 900 | 9 |
| TiC | $TiCl_4$: 2, $CH_4$: 11, $H_2$: the rest | 1010 | 10 |
| TiCNO | $TiCl_4$: 1.5, $CH_4$: 3.4, $N_2$: 27, $CO_2$: 1.0, $H_2$: the rest | 1010 | 10 |
| TiNO | $TiCl_4$: 1.5, $N_2$: 27, $CO_2$: 1.0, $H_2$: the rest | 1010 | 10 |
| $Al_2O_3$ | $AlCl_3$: 15, HCl: 2, $CO_2$: 4, $H_2S$: 0.4, $H_2$: the rest | 1005 | 6 |
| TiN layer as surface layer | $TiCl_4$: 2.0, $N_2$: 44, $H_2$: the rest | 1010 | 80 |

*TiCN1: Mixed gas composition ($N_2$ amount, $H_2$ amount, $CH_3CN$ amount) and reactor temperature were continuously changed.

TABLE 7

| Sample No. | Layer thickness of hard coating layer[Note 1](μm) | | | | | $r_R$[Note 2] $r'_R$[Note 3] | | | $r_F$[Note 4] $r'_F$[Note 5] | | |
|---|---|---|---|---|---|---|---|---|---|---|---|
| | Under layer (First layer) | Second layer TiCN layer | Third layer Intermediate layer | Fourth layer $Al_2O_3$ layer | Surface layer (Fifth layer) | $r_{AR}$ | Center | $r_{BR}$ | $r_{AF}$ | Center | $r_{BF}$ |
| III-1 | TiN (1) | TiCN1 (9) | TiNO (1) | α-$Al_2O_3$ (5) | TiN (1) | 0.4 1.0 | 1.0 1.0 | 2.2 0.2 1.0 1.0 | | 0.6 1.0 | 1.2 1.0 |
| III-2 | TiN (0.2) | TiCN2 (6) | TiCNO (0.2) | α-$Al_2O_3$ (4) | TiN (2) | 0.45 2.2 | 2.1 2.0 | 4.3 0.1 2.0 3.3 | | 1.0 2.9 | 1.5 3.1 |
| *III-3 | TiN (1) | TiCN1 (4) | TiC (1) | α-$Al_2O_3$ (2) | TiN (1) | 1.0 1.5 | 1.0 1.0 | 1.0 1.0 0.5 2.1 | | 1.0 2.1 | 1.0 2.1 |
| *III-4 | Nothing | TiCN2 (5) | Nothing (0) | α-$Al_2O_3$ (3) | TiN (0.5) | 2.0 0.6 | 1.8 0.5 | 1.0 2.0 0.5 2.2 | | 1.8 2.0 | 1.0 2.0 |
| *III-5 | TiN (0.5) | TiCN1 (10) | TiC (0.5) | κ-$Al_2O_3$ (4.5) | TiN (1.5) | 0.2 1.9 | 1.0 1.9 | 2.0 0.4 1.9 1.0 | | 2.7 1.0 | 2.7 1.0 |

TABLE 7-continued

| *III-6 | TiN (2.5) | TiCN1 (4) | TiCNO (1) | α-Al$_2$O$_3$ (4) | Nothing | 1.3 1.5 | 3.0 1.7 | 2.3 1.5 2.0 0.8 | 6.0 1.0 | 5.0 1.4 |
|---|---|---|---|---|---|---|---|---|---|---|

| Sample No. | $r_{AR}/r_{AF}$ | $r_{BR}/r_{BF}$ | Maximum peak of TiN layer as first layer TiN(hkl) | Maximum peak on the Inner surface side of TiCN layer | $R_{AR}$ [Note 6] $R_{AR}'$ [Note 7] $R_{AR}''$ [Note 8] Inner surface side | Center | Outer surface side | $R_{AR}/R_{AF}$ | $R_{BR}/R_{BF}$ |
|---|---|---|---|---|---|---|---|---|---|
| III-1 | 2.0 | 1.8 | (111) | (422) | 0.4 1.0 9.0 | 1.0 1.0 5.2 | 2.2 1.0 3.0 | 2.0 | 1.8 |
| III-2 | 4.5 | 2.9 | (111) | (422) | 0.45 2.2 3.5 | 2.1 2.0 3.5 | 4.3 2.0 3.5 | 4.5 | 2.9 |
| *III-3 | 1.0 | 1.0 | (222) | (311) | 10.0 1.5 20.5 | 10.0 1.0 18.7 | 10.0 0.5 19.2 | 1.0 | 1.0 |
| *III-4 | 1.0 | 1.0 | No TiN | (220) | — 0.6 15.2 | — 0.5 16.8 | — 0.5 17.3 | — | — |
| *III-5 | 0.5 | 0.7 | (222) | (111) | 10.4 1.9 23.0 | 15.9 1.9 46.0 | 7.2 1.9 34.0 | 0.7 | 1.3 |
| *III-6 | 0.9 | 0.5 | (311) | (222) | 3.0 1.5 46.0 | 3.2 1.7 45.0 | 3.2 2.0 45.0 | 1.0 | 0.6 |

The samples marked "*" are out of the scope of the present invention.
[Note 1] Mean layer thickness in the cutting face of each coating layer
[Note 2] $r_r$: Ratio of peak strength (422)/(111) in the rake face of TiCN layer in XRD
[Note 3] $r_r'$: Ratio of peak strength (311)/(220) in the rake face of TiCN layer in XRD
[Note 4] $r_f$: Ratio of peak strength (422)/(111) in the flank of TiCN layer in XRD
[Note 5] $r_f'$: Ratio of peak strength (311)/(220) in the flank of TiCN layer in XRD
[Note 6] $R_{Ar}$: Ratio of peak strength (422)/(hkl) of TiCN layer in XRD (hkl) peak is the maximum peak of TiN layer as the first layer.
[Note 7] $R_{Ar}'$: Ratio of peak strength (311)/(220) of TiCN layer in XRD
[Note 8] $R_{Ar}''$: Ratio of peak strength (422)/(200) of TiCN layer in XRD

TABLE 8

| Sample No. | TiCN layer $T_{CR}/T_{CF}$ | $w_R/w_F$ | $t_R/t_F$ | Adhesion (N) | Cutting evaluation[Note 1] Maximum flank wear (mm) | Nose wear amount (mm) | Number of shocks (times) |
|---|---|---|---|---|---|---|---|
| III-1 | 2.4 | 0.4 | 0.9 | 110 | 0.150 | 0.101 | 2800 |
| III-2 | 1.8 | 0.7 | 1.1 | 100 | 0.183 | 0.123 | >3000 |
| *III-3 | 1 | 1.0 | 1 | 80 | 0.274 | 0.182 | 1500 |
| *III-4 | 1 | 1.0 | 1.1 | 40 | 0.350 | 0.232 | 1100 |
| *III-5 | 0.5 | 1.2 | 1 | 80 | 0.203 | 0.151 | 800 |
| *III-6 | 0.7 | 1.3 | 1.1 | 65 | 0.510 | 0.220 | 250 |

The samples marked "*" are out of the scope of the present invention.
[Note 1] Wear amount (unit: mm) was evaluated when cutting time was 12 minutes. The number of shocks applied in fracture resistance test was up to 3000.

It will be noted from Tables 5 to 8 that in Samples Nos. III-3 to III-6, in which a texture coefficient $T_{CR}$ on the (422)-crystal plane of the TiCN layer in the rake face was smaller than or equal to a texture coefficient $T_{CF}$ on the (422)-crystal plane of the TiCN layer in the flank, welding occurred on the rake face side thereby to cause flaking of the layer, or the flank was apt to cause fracture due to chipping or the like.

Conversely, Samples Nos. III-1 and III-2, in which a texture coefficient $T_{CR}$ in the rake face was larger than a texture coefficient $T_{CF}$ in the flank in accordance with the present invention, were unsusceptible to flaking and fracture of the hard coating layer, achieving excellent cutting performance.

It is further understood by those skilled in the art that the foregoing description is a preferred embodiment of the disclosed surface coated member and the cutting tool and that various changes and modifications may be made in the invention without departing from the spirit and scope thereof.

What is claimed is:

1. A surface coated member comprising a substrate composed of a hard material; and a hard coating layer containing at least a TiCN layer on a surface of the substrate, wherein the TiCN layer has a ratio r representing a ratio of a peak strength $I_{(422)}$ of a (422)-crystal plane to a peak strength $I_{(111)}$ of a (111)-crystal plane, namely ($I_{(422)}/I_{(111)}$), in an X-ray diffraction analysis of the TiCN layer, and wherein the ratio r is progressively increased from the inner surface side of the TiCN layer to the outer surface side of the TiCN layer.

2. The surface coated member according to claim 1, wherein the TiCN layer has a ratio $r_A$ and a ratio $r_B$, wherein the ratio $r_A$ is the ratio r when an X-ray diffraction analysis is conducted in a state in which a region extending in a thickness of not more than 1.5 μm from the interface on the inner surface side is exposed in the TiCN layer, wherein the ratio $r_B$ is the ratio r when an X-ray diffraction analysis is conducted in a state in which a region extending in a thickness of not more than 1.5 μm from the interface on the outer surface side is exposed in the TiCN layer, and wherein the ratio $r_A$ is not more than 0.5, and the ratio $r_B$ is not less than 1.

3. The surface coated member according to claim 1, wherein the hard coating layer has an $Al_2O_3$ layer on the outer surface side of the TiCN layer.

4. The surface coated member according to claim 3, wherein the $Al_2O_3$ layer has α type crystalline structure.

5. The surface coated member according to claim 3, wherein at least one layer selected from the group consisting of a TiN layer, a TiCN layer, a TiC layer, a TiCNO layer, a TiCO layer, and a TiNO layer is formed in a layer thickness of 0.01 to 0.2 μm between the TiCN layer and the $Al_2O_3$ layer.

6. A surface coated member comprising a substrate composed of a hard material; and a hard coating layer containing a TiN layer and a TiCN layer that are laminated in this order on the surface of the substrate,
wherein a (hkl)-crystal plane (except for a (422)-crystal plane) is a diffraction plane on which the maximum peak strength in the X-ray diffraction analysis of the TiN layer is achieved,
wherein the TiCN layer has a ratio R representing a ratio of a peak strength $I_{(422)}$ of a (422)-crystal plane to a peak strength $I_{(hkl)}$ of the (hkl)-crystal plane, namely ($I_{(422)}/I_{(hkl)}$) in the X-ray diffraction analysis of the TiCN layer, and wherein the ratio R is progressively increased from the inner surface side of the TiCN layer to the outer surface side of the TiCN layer.

7. The surface coated member according to claim 6, wherein the maximum peak strength in the X-ray diffraction analysis of a region on the inner surface side in the TiCN layer is achieved on the (hkl)-crystal plane.

8. The surface coated member according to claim 6, wherein the TiCN layer has a ratio $R_A$ and a ratio $R_B$, wherein the ratio $R_A$ is the ratio R when an X-ray diffraction analysis is conducted in a state in which a region extending in a thickness of not more than 1.5 μm from the interface on the inner surface side is exposed in the TiCN layer, wherein the ratio $R_B$ is the ratio R when an X-ray diffraction analysis is conducted in a state in which a region extending in a thickness of not more than 1.5 μm from the interface on the outer surface side is exposed in the TiCN layer, and wherein the ratio $R_A$ is not more than 0.5, and the ratio $R_B$ is not less than 1.

9. The surface coated member according to claim 6, wherein the hard coating layer has an $Al_2O_3$ layer on the outer surface of the TiCN layer.

10. The surface coated member according to claim 9, wherein the $Al_2O_3$ layer has α type crystalline structure.

11. The surface coated member according to claim 9, wherein at least one layer selected from the group consisting of a TiN layer, a TiCN layer, a TiC layer, a TiCNO layer, a TiCO layer, and a TiNO layer is formed in a layer thickness of 0.01 to 0.2 μm between the TiCN layer and the $Al_2O_3$ layer.

* * * * *